(12) United States Patent
Lee et al.

(10) Patent No.: US 11,387,229 B2
(45) Date of Patent: Jul. 12, 2022

(54) SEMICONDUCTOR DEVICE

(71) Applicant: Samsung Electronics Co., Ltd., Suwon-si (KR)

(72) Inventors: Jaeha Lee, Hwaseong-si (KR); Ha-Young Kim, Seoul (KR); Bonghyun Lee, Suwon-si (KR); Soyoung Lee, Seoul (KR); Yongeun Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 284 days.

(21) Appl. No.: 16/826,756

(22) Filed: Mar. 23, 2020

(65) Prior Publication Data

US 2020/0395354 A1   Dec. 17, 2020

(30) Foreign Application Priority Data

Jun. 14, 2019   (KR) .................. 10-2019-0071019
Nov. 20, 2019   (KR) .................. 10-2019-0149828

(51) Int. Cl.
*H01L 29/76* (2006.01)
*H01L 27/02* (2006.01)
*G06F 30/398* (2020.01)
*G06F 30/394* (2020.01)
*G06F 30/392* (2020.01)

(52) U.S. Cl.
CPC ........ *H01L 27/0207* (2013.01); *G06F 30/392* (2020.01); *G06F 30/394* (2020.01); *G06F 30/398* (2020.01)

(58) Field of Classification Search
CPC . H01L 27/0207; G06F 30/392; G06F 30/398; G06F 30/394
USPC ...................................................... 257/401
See application file for complete search history.

(56) References Cited

U.S. PATENT DOCUMENTS

| | | | |
|---|---|---|---|
| 10,026,688 | B2 | 7/2018 | Lee et al. |
| 10,037,401 | B2 | 7/2018 | Song et al. |
| 10,157,922 | B2 | 12/2018 | Lin et al. |
| 2017/0294430 | A1 | 10/2017 | Seo et al. |
| 2017/0371995 | A1 | 12/2017 | Correale, Jr. et al. |
| 2018/0107780 | A1 | 4/2018 | Chen et al. |
| 2018/0254287 | A1* | 9/2018 | Seo ............... H01L 23/528 |
| 2018/0350791 | A1* | 12/2018 | Do ................ H01L 27/11807 |
| 2019/0065650 | A1 | 2/2019 | Pelloie |
| 2019/0065653 | A1 | 2/2019 | Biswas et al. |

(Continued)

*Primary Examiner* — Luan C Thai
(74) *Attorney, Agent, or Firm* — Harness, Dickey & Pierce, P.L.C.

(57) ABSTRACT

Disclosed is a semiconductor device comprising a logic cell including first and second active regions spaced apart in a first direction on a substrate, first and second active patterns on the first and second active regions and extend in a second direction, first and second source/drain patterns on the first and second active patterns, gate electrodes extending in the first direction to run across the first and second active patterns and arranged in the second direction at a first pitch, first lines in a first interlayer dielectric layer on the gate electrodes and each electrically connected to the first source/drain pattern, the second source/drain pattern, or the gate electrode, and second lines in a second interlayer dielectric layer on the first interlayer dielectric layer and extending parallel to each other in the first direction.

20 Claims, 23 Drawing Sheets

(56) References Cited

U.S. PATENT DOCUMENTS

2019/0096870 A1 3/2019 Liaw
2019/0155984 A1 5/2019 Chen et al.

* cited by examiner

SEMICONDUCTOR DEVICE

CROSS-REFERENCE TO RELATED APPLICATIONS

This U.S. nonprovisional application claims priority under 35 U.S.C § 119 to Korean Patent Application Nos. 10-2019-0071019 filed on Jun. 14, 2019 and 10-2019-0149828 filed on Nov. 20, 2019, in the Korean Intellectual Property Office, the disclosures of which are hereby incorporated by reference in their entirety.

BACKGROUND

The present inventive concepts relate to semiconductor devices, and more particularly, to semiconductor devices including a field effect transistor.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices have been gradually complicated and integrated to meet these requested characteristics.

SUMMARY

Some example embodiments of the present inventive concepts provide a semiconductor device including a field effect transistor that has enhanced electrical characteristics.

According to some example embodiments of the present inventive concepts, a semiconductor device may comprise: a logic cell on a substrate, the logic cell including a first active region and a second active region that are spaced apart from each other in a first direction; a first active pattern and a second active pattern respectively on the first active region and the second active region, the first and second active patterns extending in a second direction that intersects the first direction; a first source/drain pattern and a second source/drain pattern respectively on an upper portion of the first active pattern and an upper portion of the second active pattern; a plurality of gate electrodes that run across the first and second active patterns and extend in the first direction, the gate electrodes being arranged in the second direction at a first pitch; a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and a plurality of second lines in a second interlayer dielectric layer on the first interlayer dielectric layer, the second lines extending parallel to each other in the first direction. The first lines may include first to third pin lines. The second lines may include first to third routing lines. The first to third pin lines may be electrically connected respectively to the first to third routing lines. A length in the second direction of each of the first to third pin lines may be less than twice the first pitch. A first overlap region may be defined where adjacent ones of the first to third pin lines overlap each other in the first direction. A length in the second direction of the first overlap region may be less than the first pitch.

According to some example embodiments of the present inventive concepts, a semiconductor device may comprise: a logic cell on a substrate, the logic cell including a first active region and a second active region that are spaced apart from each other in a first direction; a first active pattern and a second active pattern respectively on the first active region and the second active region, the first and second active patterns extending in a second direction that intersects the first direction; a device isolation layer that covers lower sidewalls of the first and second active patterns, an upper portion of each of the first and second active patterns vertically protruding upwards from the device isolation layer; a first source/drain pattern and a second source/drain pattern respectively on the upper portion of the first active pattern and the upper portion of the second active pattern; a plurality of gate electrodes that run across the first and second active patterns and extend in the first direction, the gate electrodes being arranged in the second direction at a first pitch; a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and a plurality of second lines in a second interlayer dielectric layer on the first interlayer dielectric layer, the second lines extending parallel to each other in the first direction. The first lines may include first to third pin lines. The second lines may include first to third routing lines. The first to third pin lines may be electrically connected respectively to the first to third routing lines. A length in the second direction of each of the first to third pin lines may be less than twice the first pitch. A first overlap region may be defined where the first to third pin lines overlap each other in the first direction. A length in the second direction of the first overlap region may be less than the first pitch.

According to some example embodiments of the present inventive concepts, a semiconductor device may comprise: a logic cell on a substrate, the logic cell including a first active region and a second active region that are spaced apart from each other in a first direction; a first active pattern and a second active pattern respectively on the first active region and the second active region, the first and second active patterns extending in a second direction that intersects the first direction, the first active pattern including a plurality of first channel patterns that are vertically stacked, and the second active pattern including a plurality of second channel patterns that are vertically stacked; a first source/drain pattern and a second source/drain pattern, the first source/drain pattern being on one side of the first channel patterns, and the second source/drain pattern being on one side of the second channel patterns; a plurality of gate electrodes that run across the first and second active patterns and extend in the first direction, the gate electrodes being arranged in the second direction at a first pitch; a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and a plurality of second lines in a second interlayer dielectric layer on the first interlayer dielectric layer, the second lines extending parallel to each other in the first direction. A first gate electrode of the gate electrodes may be on a top surface, a bottom surface, and opposite sidewalls of each of the first channel patterns. A second gate electrode of the gate electrodes may be on a top surface, a bottom surface, and opposite sidewalls of each of the second channel patterns. The first lines may include first to third pin lines. The second lines may include first to third routing lines. The first to third pin lines may be electrically connected respectively to the first to third routing lines. A length in the second direction of each of the first to third pin lines may be less than twice the first pitch. A first overlap region may be defined where the first to third pin lines overlap each other in the first direction. A length in the second direction of the first overlap region may be less than the first pitch.

DETAILED DESCRIPTION OF EMBODIMENTS

Figure 1:
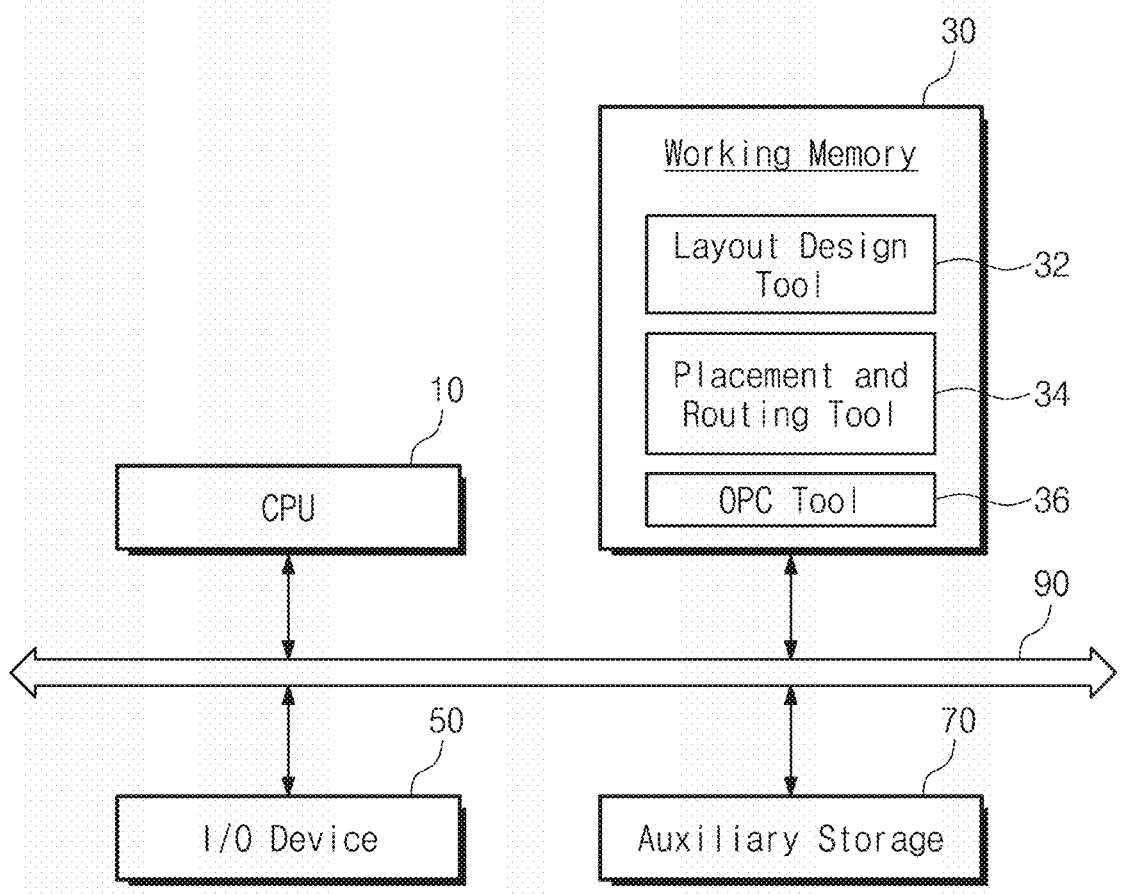
FIG. 1 illustrates a block diagram showing a computer system for semiconductor design, according to some example embodiments of the present inventive concepts.

FIG. 1 illustrates a block diagram showing a computer system for semiconductor design, according to some example embodiments of the present inventive concepts. Referring to FIG. 1, a computer system may include a central processing unit (CPU) 10, a working memory 30, an input/output (I/O) device 50, and an auxiliary storage 70. The computer system may be provided as a dedicated device for designing a layout according to the present inventive concepts. The computer system may be configured to drive various programs for design and verification simulation.

The CPU 10 may allow the computer system to execute software (e.g., application programs, operating system, and device drivers). The CPU 10 may process an operating system loaded in the working memory 30. The CPU 10 may execute various application programs driven based on the operating system. For example, the CPU 10 may process a layout design tool 32, a placement and routing tool 34, and/or an OPC tool 36 that are loaded in the working memory 30.

The operating system or application programs may be loaded in the working memory 30. When the computer system is booted up, based on booting sequence, an operating system image (not shown) stored in the auxiliary storage 70 may be loaded to the working memory 30. Overall input/output operations of the computer system may be supported by the operating system. Likewise, the working memory 30 may be loaded with the application programs that are selected by a user or provided for a basic service.

The layout design tool 32 for layout design may be loaded from the auxiliary storage 70 to the working memory 30. The working memory 30 may be loaded from the auxiliary storage 70 with the placement and routing tool 34 that places designed standard cells and routes the placed standard cells. The working memory 30 may be loaded from the auxiliary storage 70 with the OPC tool 36 that performs an optical proximity correction (OPC) on designed layout data.

The layout design tool 32 may include a bias function by which specific layout patterns are changed in shapes and positions defined by a design rule. In addition, the layout design tool 32 may perform a design rule check (DRC) under the changed bias data condition. The working memory 30 may be either a volatile memory such as static random access memory (SRAM) or dynamic random access memory (DRAM) or a nonvolatile memory such as phase change random access memory (PRAM), magnetic random access memory (MRAM), resistance random access memory (ReRAM), ferroelectric random access memory (FRAM), or NOR Flash memory.

The I/O device 50 may control user input/output operations of user interfaces. For example, the I/O device 50 may include a keyboard or a monitor, allowing a designer to put relevant information. The user may use the I/O device 50 to receive information about a semiconductor region or data paths requiring adjusted operating characteristics. The I/O device 50 may display a progress status or a process result of the OPC tool 36.

The auxiliary storage 70 may serve as a storage medium for the computer system. The auxiliary storage 70 may store the application programs, the operating system image, and various data. The auxiliary storage 70 may be provided in the form of one among memory cards (e.g., MMC, eMMC, SD, and Micro SD) and a hard disk drive (HDD). The auxiliary storage 70 may include a NAND Flash memory having large memory capacity. Alternatively, the auxiliary storage 70 may include a NOR Flash memory or a next-generation volatile memory such as PRAM, MRAM, ReRAM, and FRAM.

A system interconnector 90 may be provided to serve as a system bus for providing a network in the computer system. The CPU 10, the working memory 30, the I/O device 50, and the auxiliary storage 70 may be electrically connected through the system interconnector 90 and may exchange data with each other. The system interconnector 90 is not limited to the above descriptions. For example, the system interconnector 90 may further include additional elements for increasing efficiency in data communication.

The CPU 10 (and other features, for example, the working memory 30 and subcomponents layout design tool 32, placement and routing tool 34, and OPC tool 36, I/O device 50 and auxiliary storage 70) may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 2:
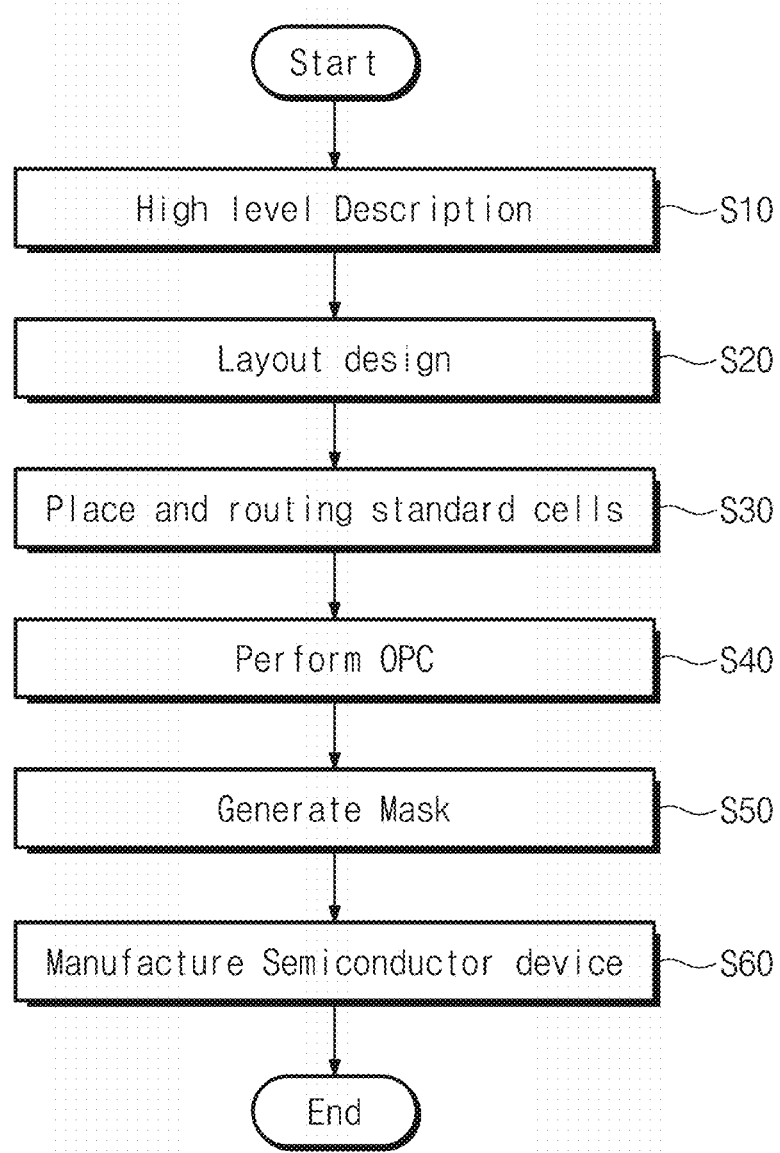
FIG. 2 illustrates a flow chart showing a method of designing and fabricating a semiconductor device, according to some example embodiments of the present inventive concepts.

FIG. 2 illustrates a flow chart showing a method of designing and fabricating a semiconductor device, according to some example embodiments of the present inventive concepts.

Referring to FIG. 2, a high-level design of a semiconductor integrated circuit may be performed using the computer system discussed with reference to FIG. 1 (S10). The high-level design may mean that an integrated circuit corresponding to a design target is described with a high-level language of a hardware description language. For example, the high-level language such as C language may be used in the high-level design. A register transfer level (RTL) coding or simulation may be used to express circuits designed by the high-level design. In addition, codes created by the RTL coding may be converted into a netlist, and the netlist may be synthesized to describe an entire semiconductor device. The synthesized schematic circuit may be verified by a simulation tool, and an adjustment process may be performed based on the verified result.

A layout design may be performed to implement on a silicon substrate a semiconductor integrated circuit that is logically completed (S20). For example, the layout design may be performed based on the schematic circuit synthesized in the high-level design or the netlist corresponding to the schematic circuit.

A cell library for the layout design may include information about operation, speed, and power consumption of the standard cell. The cell library for representing a layout of a specific gate-level circuit as a layout may be defined in the layout design tool. The layout may be prepared to define shapes or dimensions of patterns constituting transistors and metal lines that will be actually formed on a silicon substrate. For example, in order to actually form an inverter circuit on a silicon substrate, it may be necessary to appropriately place or describe layout patterns such as PMOS, NMOS, N-WELL, gate electrodes, and metal lines thereon. For this, a search may be first performed to select a suitable one of inverters predefined in the cell library.

Various standard cells stored in the cell library may be placed and routed (S30). For example, the standard cells may be placed two-dimensionally. High-level lines (routing patterns) may be provided on the placed standard cells. The standard cells may be well-designedly connected to each other through the routing step. The placement and routing of the standard cells may be automatically performed by the placement and routing tool 34.

After the routing step, a verification step may be performed on the layout to check whether any portion of the schematic circuit violates the given design rule. The verification step may include a design rule check (DRC) for verifying whether the layout meets the given design rule, an electrical rule check (ERC) for verifying whether there is an issue of an electrical disconnection in the layout, and a layout vs. schematic (LVS) for verifying whether the layout is coincident with the gate-level netlist.

An optical proximity correction (OPC) step may be performed (S40). A photolithography process may be employed to achieve on a silicon substrate the layout patterns obtained by the layout design. The optical proximity correction may be a technique for correcting an unintended optical effect occurred in the photolithography process. For example, the optical proximity correction may correct an undesirable phenomenon such as refraction or process side effects caused by characteristics of light in an exposure process using the layout patterns. When the optical proximity correction step is performed, the designed layout patterns may be slightly changed (or biased) in shapes and positions.

A photomask may be generated based on the layout changed by the optical proximity correction (S50). The photomask may generally be fabricated by describing the layout patterns using a chromium layer coated on a glass substrate.

The generated photomask may be used to manufacture a semiconductor device (S60). Various exposure and etching processes may be repeatedly performed in manufacturing the semiconductor device using the photomask. Through these processes discussed above, patterns defined in the layout design may be sequentially formed on a silicon substrate.

FIGS. 3 to 7 illustrate layouts of designed standard cells, showing the layout design step S20 of FIG. 2. FIGS. 8A to 8E illustrate layouts showing pin patterns of the standard cell shown in FIGS. 3 to 7, respectively. FIGS. 3 to 7 exemplarily show layouts of standard cells STD for a single logic circuit. For example, the same logic circuit may all be included in the standard cell STD shown in FIG. 3, the standard cell STD shown in FIG. 4, the standard cell STD shown in FIG. 5, the standard cell STD shown in FIG. 6, and the standard cell STD shown in FIG. 7. The standard cells STD of FIGS. 3 to 7 may be different in position and shape of pin patterns M1a_P.

Figure 3:
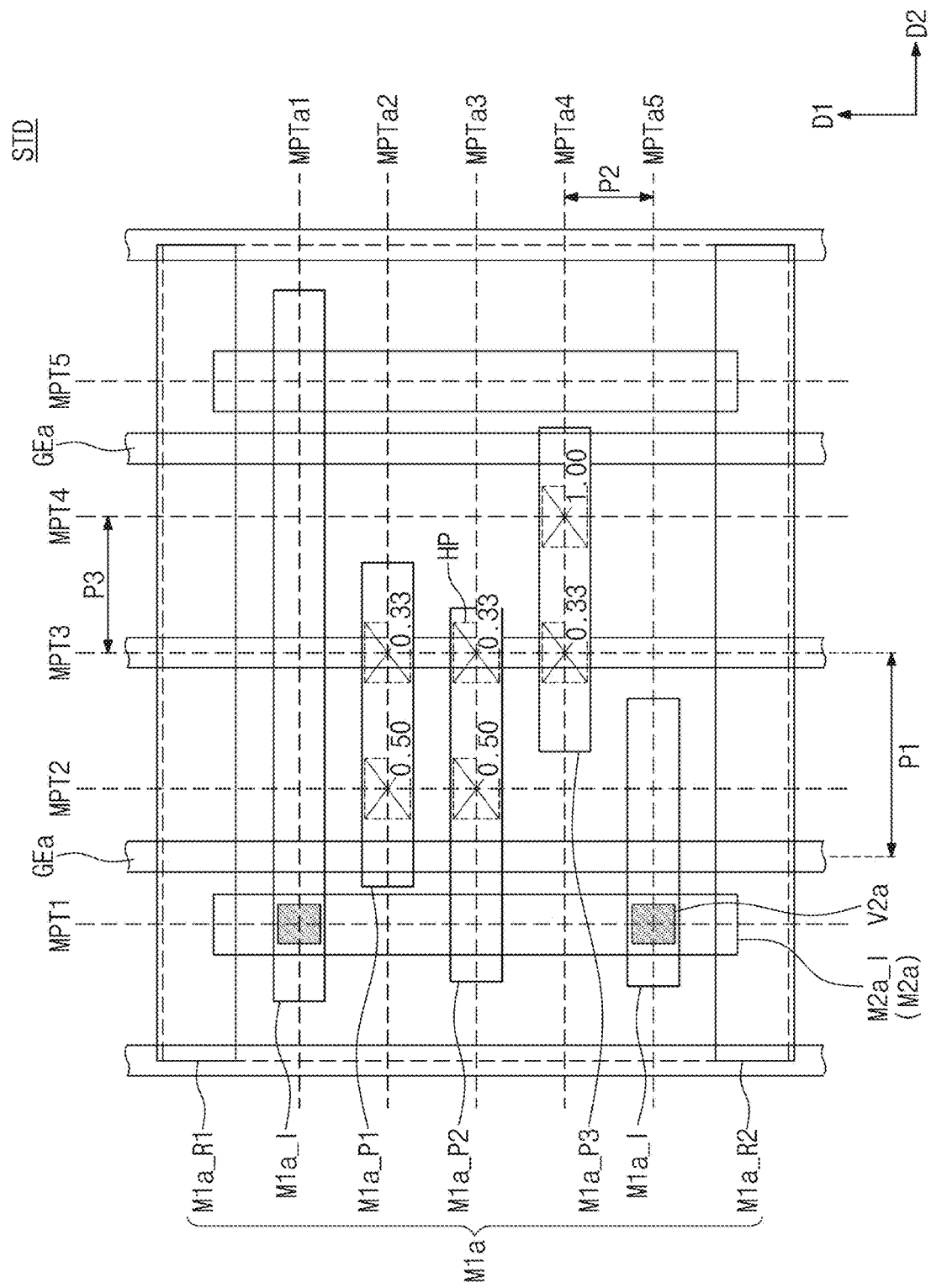
FIGS. 3 to 7 illustrate layouts of designed standard cells, showing a layout design step S20 of FIG. 2.

The following will first describe the designed standard cell STD with reference to FIG. 3. The standard cell STD may include gate patterns GEa, first line patterns M1a, second line patterns M2a, and via patterns V2a. In addition, the standard cell STD may further include other layout patterns (e.g., active regions, active contact patterns, etc.). For brevity of drawings, the other layout patterns (e.g., active regions, active contact patterns, etc.) are omitted in the standard cell STD shown in FIG. 3.

The gate patterns GEa may extend in a first direction D1 and may be arranged along a second direction D2 intersecting (e.g., perpendicular to) the first direction D1. The gate patterns GEa may be arranged at a first pitch P1. The term "pitch" may be a distance between a center of a first pattern and a center of a second pattern adjacent to the first pattern. The gate patterns GEa may define gate electrodes.

The first line patterns M1a may be positioned on a level higher than, or above, that of the gate patterns GEa. The first line patterns M1a may define a first metal layer (first lines). For example, the first line patterns M1a may include a first power pattern M1a_R1, a second power pattern M1a_R2, first inner line patterns M1a_I, and first, second, and third pin patterns M1a_P1, M1a_P2, and M1a_P3.

The first power pattern M1a_R1, the second power pattern M1a_R2, the first inner line patterns M1a_I, and the first, second, and third pin patterns M1a_P1, M1a_P2, and M1a_P3 may be patterns disposed on the same layer. The first power pattern M1a_R1, the second power pattern M1a_R2, the first inner line patterns M1a_I, and the first, second, and third pin patterns M1a_P1, M1a_P2, and M1a_P3 may extend parallel to each other along the second direction D2.

The first power pattern M1a_R1 and the second power pattern M1a_R2 may extend to run across the standard cell STD. The first inner line patterns M1a_I and the first, second, and third pin patterns M1a_P1, M1a_P2, and M1a_P3 may be disposed between the first power pattern M1a_R1 and the second power pattern M1a_R2. The first, second, and third pin patterns M1a_P1, M1a_P2, and M1a_P3 may be disposed between the first inner line patterns M1a_I.

The first inner line patterns M1a_I and the first, second, and third pin patterns M1a_P1, M1a_P2, and M1a_P3 may be arranged along the first direction D1. The first inner line patterns M1a_I and the first, second, and third pin patterns M1a_P1, M1a_P2, and M1a_P3 may be arranged at a second pitch P2. The second pitch P2 may be less than the first pitch P1.

First to fifth lower line tracks MPTa1 to MPTa5 may be imaginary lines used for placing the first line patterns M1a in the standard cell STD. The first to fifth lower line tracks MPTa1 to MPTa5 may extend in the second direction D2. The first to fifth lower line tracks MPTa1 to MPTa5 may be arranged along the first direction D1.

A single first line pattern M1a may be disposed on each of the first to fifth lower line tracks MPTa1 to MPTa5. For example, the first inner line pattern M1a_1 may be disposed on the first lower line track MPTa1, the first pin pattern M1a_P1 may be disposed on the second lower line track MPTa2, the second pin pattern M1a_P2 may be disposed on the third lower line track MPTa3, the third pin pattern M1a_P3 may be disposed on the fourth lower line pattern MPTa4, and the first inner line pattern M1a_I may be disposed on the fifth lower line track MPTa5.

The second line pattern M2a may be positioned on a level higher than that of the first line patterns M1a. The second line pattern M2a may define a second metal layer (a second line). For a layout of the standard cell STD prior to routing, the second line pattern M2a may include a second inner line pattern M2a_I. The second inner line pattern M2a_I may extend along the first direction D1. The second inner line pattern M2a_I may be parallel to the gate patterns GEa.

First to fifth line tracks MPT1 to MPT5 may be imaginary lines used for placing the second line pattern M2a in the standard cell STD. The first to fifth line tracks MPT1 to MPT5 may extend in the first direction D1. For example, the second inner line pattern M2a_I may be disposed on the first line track MPT1. A center of the second inner line pattern M2a_I may be aligned with the first line track MPT1.

The first to fifth line tracks MPT1 to MPT5 may be arranged along the second direction D2 at a third pitch P3. The third pitch P3 may be less than the first pitch P1. The third pitch P3 may be greater than the second pitch P2.

The via pattern V2a may be disposed on a region where the first line pattern M1a overlaps the second line pattern M2a. For example, the via pattern V2a may be disposed between the first inner line pattern M1a_I and the second inner line pattern M2a_I.

The via pattern V2a may define a via that vertically connects a first line (e.g., the first line pattern M1a) to a second line (e.g., the second line pattern M2a). The second metal layer may be constituted by the via patterns V2a together with the second line pattern M2a.

The first, second, and third pin patterns M1a_P1, M1a_P2, and M1a_P3 may define pin lines in the first metal layer. For example, the pin line may be a line through which signals are input to the standard cell STD. For example, the pin line may be a line through which signals are output from the standard cell STD.

A hit point HP may be defined in each of the first, second, and third pin patterns M1a_P1, M1a_P2, and M1a_P3. The hit point HP may be defined at a place where the pin pattern M1a_P and a line track MPT intersect each other. For example, the hit point HP may be defined at an intersection between the first pin pattern M1a_P1 and the second line track MPT2. The hit point HP may be defined at an intersection between the first pin pattern M1a_P1 and the third line track MPT3.

The hit point HP may be a location through which signals are input to or output from the standard cell STD. As discussed below, at the routing step S30, the via pattern V2a and a high-level routing pattern may be disposed on the hit point HP.

An average hit probability value may be calculated for each of the first, second, and third pin patterns M1a_P1, M1a_P2, and M1a_P3. The average hit probability value may be defined as a sum of probabilities that the via pattern V2a is disposed on each hit point HP of the pin pattern M1a_P. The average hit probability value for each pin pattern may be expressed by Equation 1 below.

$$\sum_{n=1}^{all} \left( \frac{\text{hit } point_n}{\text{hit point } stack_n} \right) \quad \text{[Equation 1]}$$

For example, two hit points HP (the hit point $stack_n$ of Equation 1 above) may be defined on the second line track MPT2. Only a single via pattern V2a (the hit $point_n$ of Equation 1 above) may be disposed on the second line track MPT2. Therefore, the hit point HP on the second line track MPT2 may have a 0.5 probability value of placement of the via pattern V2a.

Three hit points HP may be defined on the third line track MPT3. Only a single via pattern V2a may be disposed on the third line track MPT3. Therefore, the hit point HP on the third line track MPT3 may have a 0.33 probability value of placement of the via pattern V2a.

One hit point HP may be defined on the fourth line track MPT4. Only a single via pattern V2a may be disposed on the fourth line track MPT4. Therefore, the hit point HP on the fourth line track MPT4 may have a 1.00 probability value of placement of the via pattern V2a.

The first pin pattern M1a_P1 may have an average hit probability value of 0.83, or a sum of 0.50 and 0.33 (see Equation 1). The second pin pattern M1a_P2 may have an average hit probability value of 0.83, or a sum of 0.50 and 0.33. The third pin pattern M1a_P3 may have an average hit probability value of 1.33, or a sum of 0.33 and 1.00. For the standard cell STD of FIG. 3, the average hit probability value of each of the first and second pin patterns M1a_P1 and M1a_P2 may be less than 1.00.

It may be preferable that the average hit probability value of each of the first, second, and third pin patterns M1a_P1, M1a_P2, and M1a_P3 is equal to or greater than 1.00. Specifically, a range of the average hit probability value of each fin pattern according to the present invention may be represented by Equation 2 below.

$$1 \leq \sum_{n=1}^{all} \left( \frac{\text{hit } point_n}{\text{hit point } stack_n} \right) \leq \text{minimum hit point} \quad \text{[Equation 2]}$$

The average hit probability value of each pin pattern means the minimum number of hit points required.

The average hit probability value of the first pin pattern M1a_P1 may be 0.83 less than 1.00. The average hit probability value of the second pin pattern M1a_P2 may be 0.83 less than 1.00. That is, the average hit probability value of the first pin pattern M1a_P1 and the average hit probability value of the second pin pattern M1a_P2 do not satisfy Equation 2 of the present invention. When an average hit probability value of the pin pattern M1a_P is less than 1.00, a routing efficiency may decrease and a capacitance between lines may increase.

Figure 8A:
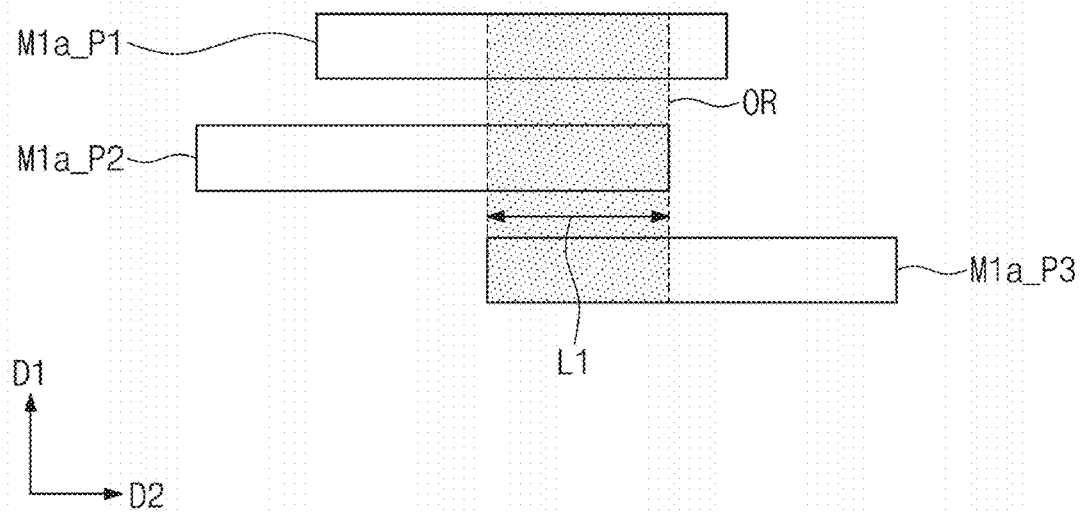
FIGS. 8A to 8E illustrate layouts showing pin patterns of the standard cell shown in FIGS. 3 to 7, respectively.

For example, referring to FIG. 8A, an overlap region OR may be defined where the first, second, and third pin patterns M1a_P1, M1a_P2, and M1a_P3 overlap each other in the first direction D1. The overlap region OR may have a first length L1 in the second direction D2. The first length L1 may be relatively large. The first length L1 may be greater than the third pitch P3. Because the first length L1 of the overlap region OR is relatively large, a relatively high capacitance may be provided between pin lines which will be formed from the first, second, and third pin patterns M1a_P1, M1a_P2, and M1a_P3.

Figure 4:
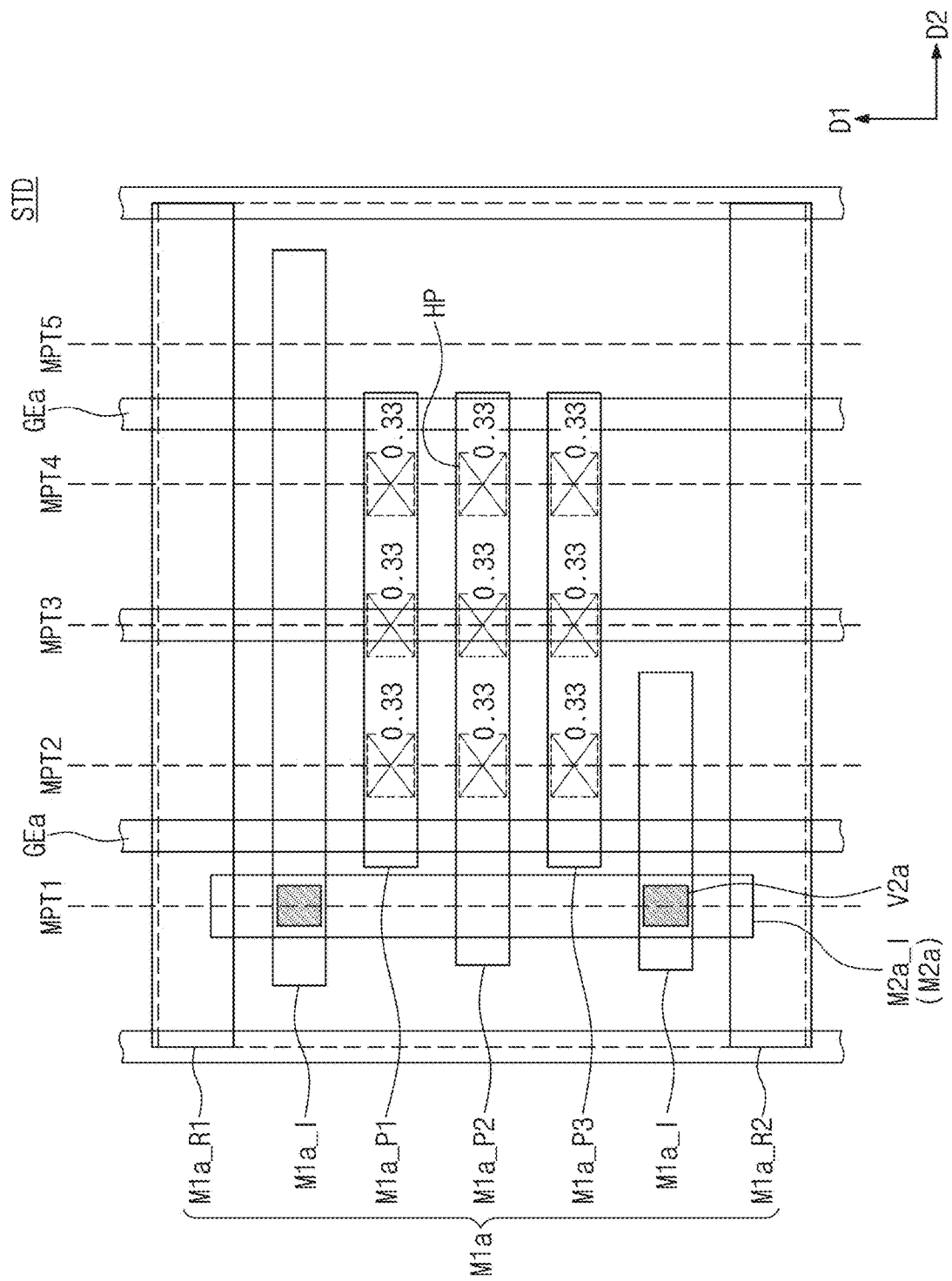

The following will describe the designed standard cell STD with reference to FIG. 4. In the example embodiments that follow, omission will be made to avoid repetition of the standard cell STD discussed above with reference to FIG. 3, and differences will be explained in detail. The hit points HP may be defined on the first, second, and third pin patterns M1a_P1, M1a_P2, and M1a_P3. The number of the hit points HP on the standard cell STD shown in FIG. 4 may be greater than the number of the hit points HP on the standard cell STD shown in FIG. 3. For example, the number of positions where the via patterns V2a are possibly disposed on the standard cell STD of FIG. 4 may be greater than the number of positions where the via patterns V2a are possibly disposed on the standard cell STD of FIG. 3. The degree of routing freedom of the standard cell STD shown in FIG. 4 may be greater than the degree of routing freedom of the standard cell STD shown in FIG. 3.

The first pin pattern M1a_P1 may have an average hit probability value of 0.99, or a sum of 0.33, 0.33, and 033. The second pin pattern M1a_P2 may have an average hit probability value of 0.99, or a sum of 0.33, 0.33, and 033. The third pin pattern M1a_P3 may have an average hit probability value of 0.99, or a sum of 0.33, 0.33, and 033. For the standard cell STD of FIG. 4, the average hit probability value of each of the first, second, and third pin patterns M1a_P1, M1a_P2, and M1a_P3 may be less than 1.00. That is, all of the first, second and third pin patterns M1a_P1, M1a_P2, and M1a_P3 do not satisfy Equation 2 of the present invention.

Figure 8B:
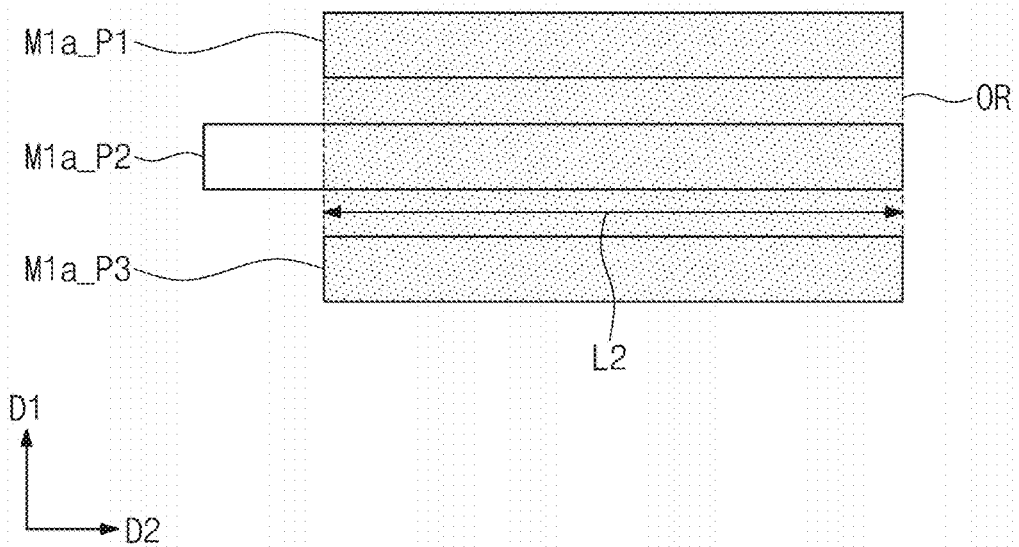

In some example embodiments, referring to FIG. 8B, an overlap region OR may be defined where the first, second, and third pin patterns M1a_P1, M1a_P2, and M1a_P3 overlap each other in the first direction D1. The overlap region OR may have a second length L2 in the second direction D2. The second length L2 may be greater than the first length L1 of FIG. 8A. Because the second length L2 of the overlap region OR is relatively large, a relatively high capacitance may be provided between pin lines which will be formed from the first, second, and third pin patterns M1a_P1, M1a_P2, and M1a_P3. In this case, the standard cell STD of FIG. 4 may securely have a high degree of routing freedom, but instead may have a problem of high capacitance between pin lines.

Figure 5:
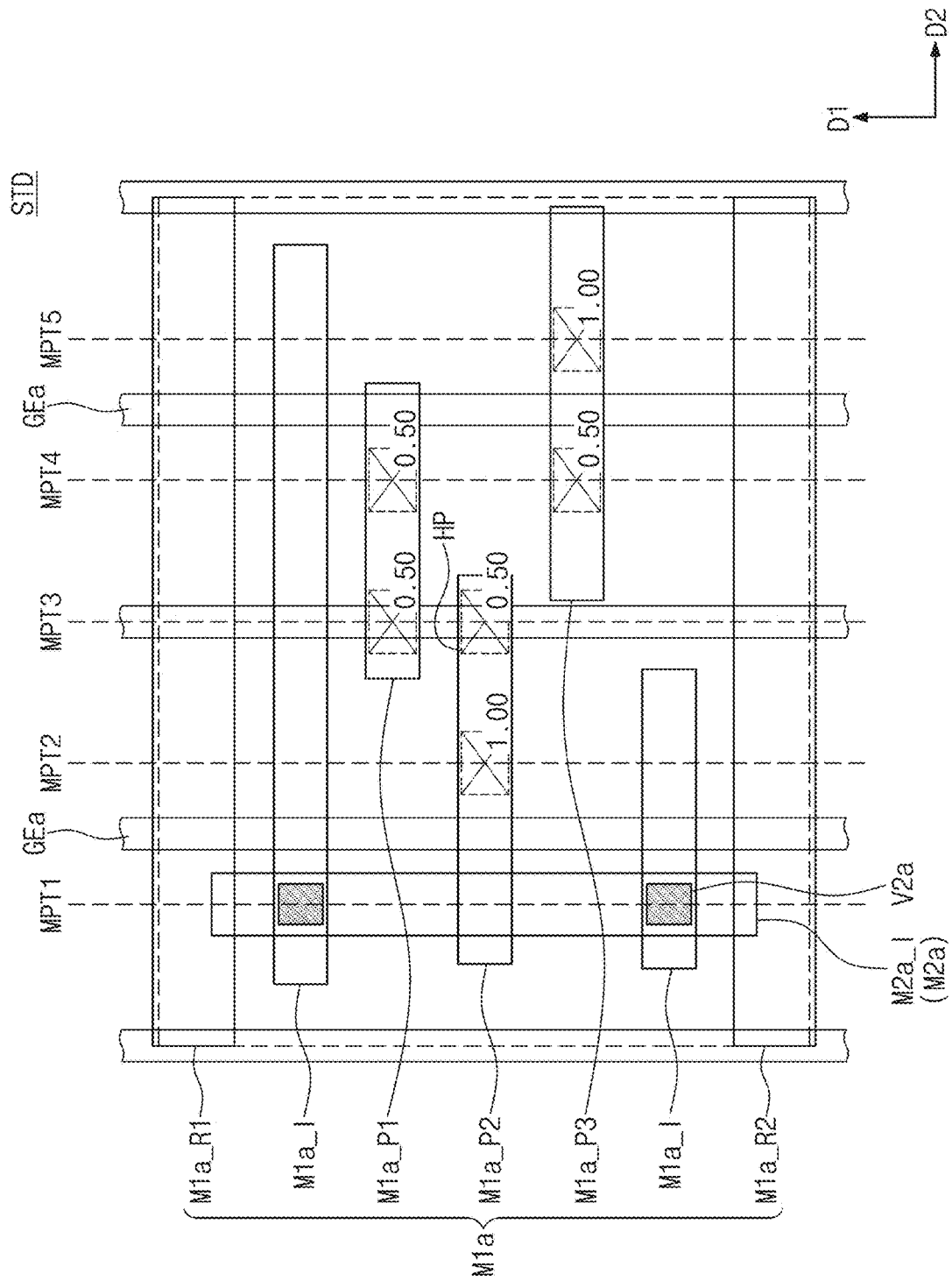

The following will describe the designed standard cell STD with reference to FIG. 5. In the example embodiments that follow, omission will be made to avoid repetition of the standard cell STD discussed above with reference to FIG. 3, and differences will be explained in detail. The hit points HP may be defined on the first, second, and third pin patterns M1a_P1, M1a_P2, and M1a_P3. The first pin pattern M1a_P1 may have an average hit probability value of 1.00, or a sum of 0.50 and 0.50. The second pin pattern M1a_P2 may have an average hit probability value of 1.50, or a sum of 1.00 and 0.50. The third pin pattern M1a_P3 may have an average hit probability value of 1.50, or a sum of 0.50 and 1.00. For the standard cell STD of FIG. 5, the average hit probability value of each of the first, second, and third pin patterns M1a_P1, M1a_P2, and M1a_P3 may be equal to or greater than 1.00. That is, all of the first, second and third fin patterns M1a_P1, M1a_P2, and M1a_P3 satisfy Equation 2 of the present invention.

Figure 8C:
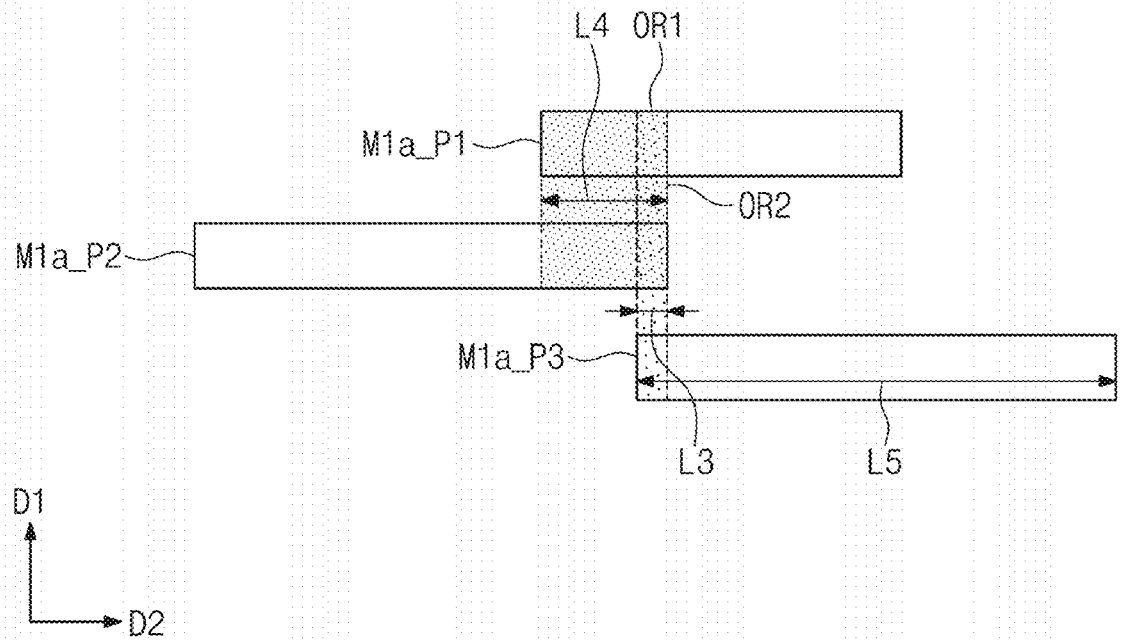

For example, referring to FIG. 8C, a first overlap region OR1 may be defined where the first, second, and third pin patterns M1a_P1, M1a_P2, and M1a_P3 overlap each other in the first direction D1. The first overlap region OR1 may have a third length L3 in the second direction D2. The third length L3 may be relatively small. The third length L3 may be less than the third pitch P3. As such, the third length L3 may be relatively small.

A second overlap region OR2 may be defined where a pair of adjacent pin patterns M1a_P overlap each other in the first direction D1. For example, the second overlap region OR2 may be defined where the first pin pattern M1a_P1 and the second pin pattern M1a_P2 overlap each other in the first direction D1.

The second overlap region OR2 may have a fourth length L4 in the second direction D2. The fourth length L4 may be relatively small. The fourth length L4 may be less than the third pitch P3. As such, the fourth length L4 may be relatively small.

Each of the first, second, and third pin patterns M1a_P1, M1a_P2, and M1a_P3 may have a length in the second direction D2 less than twice the first pitch P1. For example, the third pin pattern M1a_P3 may have a fifth length L5 in the second direction D2. The fifth length L5 may be less than twice the first pitch P1. In this sense, each of the first, second, and third pin patterns M1a_P1, M1a_P2, and M1a_P3 may have a relatively small length.

For the first, second, and third pin patterns M1a_P1, M1a_P2, and M1a_P3 of FIG. 5, the hit points HP may be uniformly distributed in the standard cell STD, which may result in a high degree of routing freedom. In addition, because a relatively small length is given to each of the first and second overlap regions OR1 and OR2 between the first, second, and third pin patterns M1a_P1, M1a_P2, and M1a_P3, a relatively low capacitance may be provided between pin lines which will be formed from the first, second, and third pin patterns M1a_P1, M1a_P2, and M1a_P3.

Figure 6:
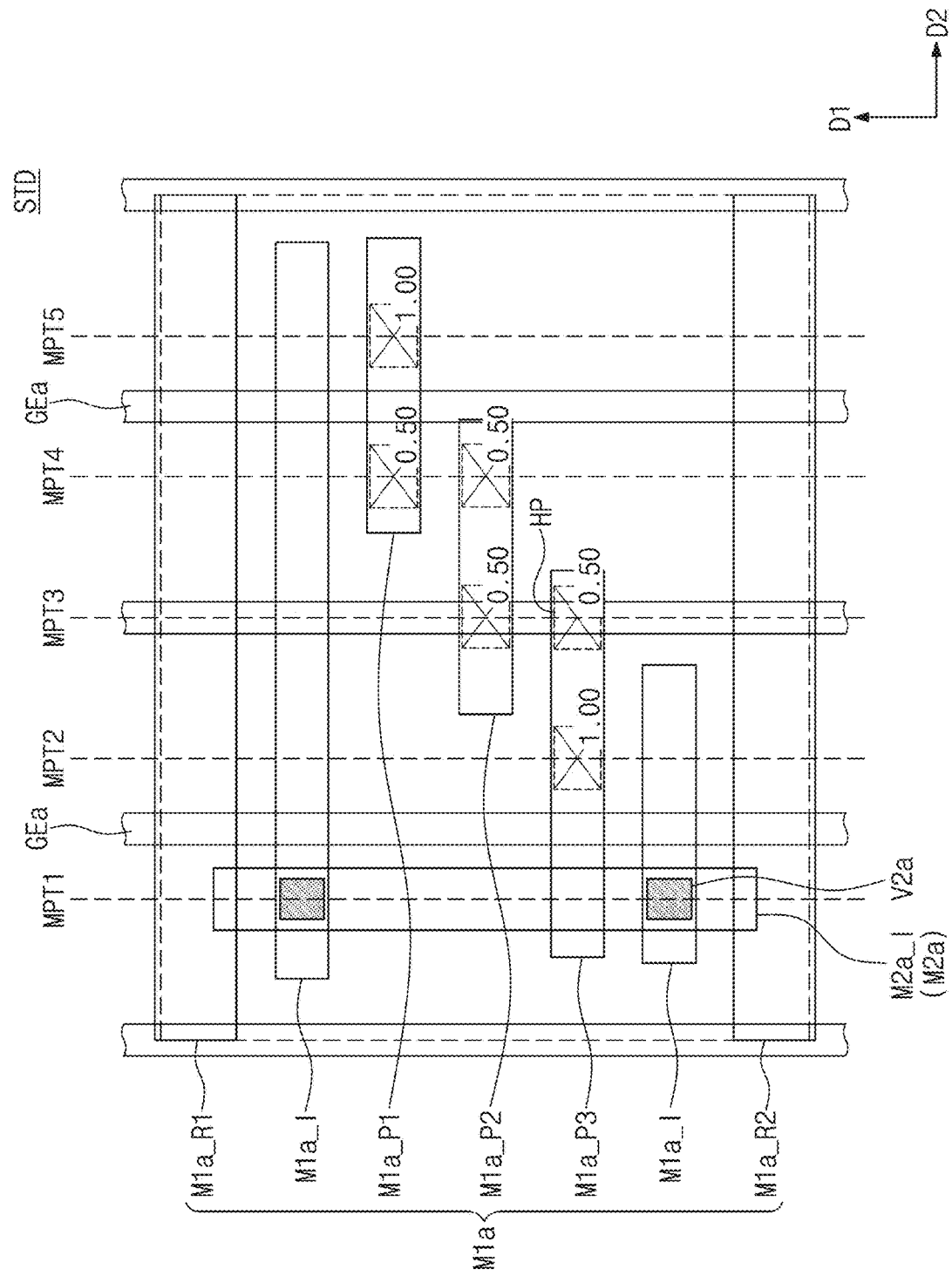

The following will describe the designed standard cell STD with reference to FIG. 6. In the example embodiments that follow, omission will be made to avoid repetition of the standard cell STD discussed above with reference to FIG. 3, and differences will be explained in detail. The hit points HP may be defined on the first, second, and third pin patterns M1a_P1, M1a_P2, and M1a_P3. The first pin pattern M1a_P1 may have an average hit probability value of 1.50, or a sum of 0.50 and 1.00. The second pin pattern M1a_P2 may have an average hit probability value of 1.00, or a sum of 0.50 and 0.50. The third pin pattern M1a_P3 may have an average hit probability value of 1.50, or a sum of 1.00 and 0.50. For the standard cell STD of FIG. 6, the average hit probability value of each of the first, second, and third pin patterns M1a_P1, M1a_P2, and M1a_P3 may be equal to or greater than 1.00. That is, all of the first, second and third fin patterns M1a_P1, M1a_P2, and M1a_P3 satisfy Equation 2 of the present invention.

Figure 8D:
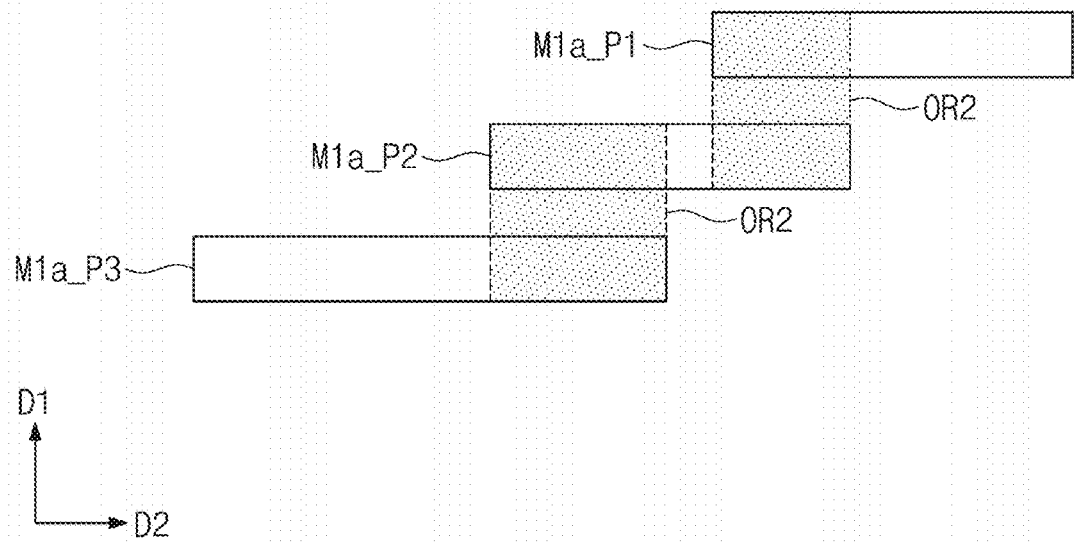

For example, referring to FIG. 8D, a first overlap region OR1 may be absent where the first, second, and third pin patterns M1a_P1, M1a_P2, and M1a_P3 overlap each other in the first direction D1. A second overlap region OR2 may be defined where a pair of adjacent pin patterns M1a_P overlap each other in the first direction D1. The second overlap region OR2 may have a length in the second direction D2 less than the third pitch P3. For example, the length of the second overlap region OR2 may be relatively small. Likewise, the standard cell STD of FIG. 5, the standard cell STD of FIG. 6 may securely have a high degree of routing freedom, and simultaneously, may decrease in capacitance between pin lines.

Figure 7:
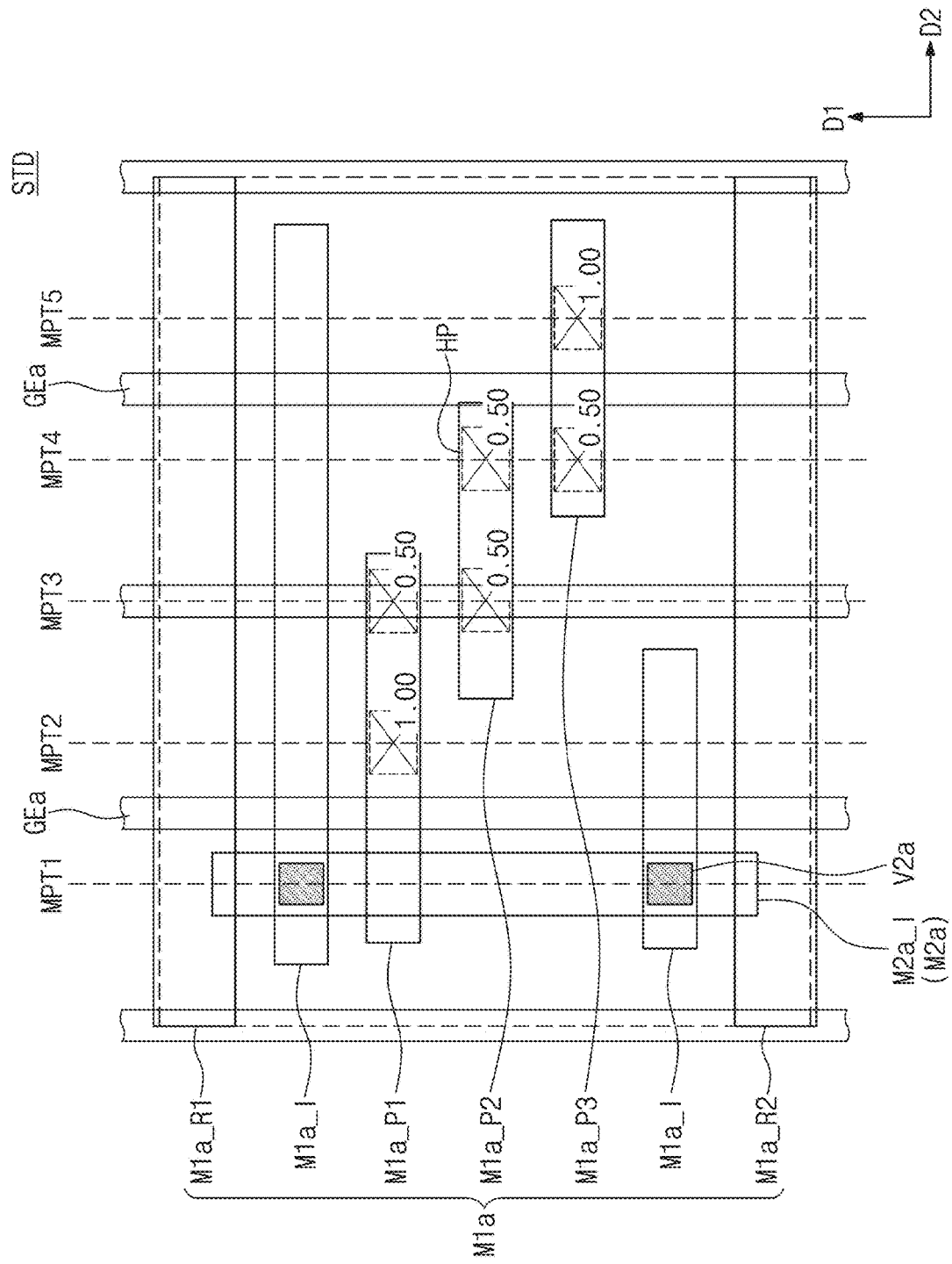

The following will describe the designed standard cell STD with reference to FIG. 7. In the example embodiments that follow, omission will be made to avoid repetition of the standard cell STD discussed above with reference to FIG. 3, and differences will be explained in detail. The hit points HP may be defined on the first, second, and third pin patterns M1a_P1, M1a_P2, and M1a_P3. The first pin pattern M1a_P1 may have an average hit probability value of 1.50, or a sum of 1.00 and 0.50. The second pin pattern M1a_P2 may have an average hit probability value of 1.00, or a sum of 0.50 and 0.50. The third pin pattern M1a_P3 may have an average hit probability value of 1.50, or a sum of 0.50 and 1.00. For the standard cell STD of FIG. 7, the average hit probability value of each of the first, second, and third pin patterns M1a_P1, M1a_P2, and M1a_P3 may be equal to or greater than 1.00.

Figure 8E:
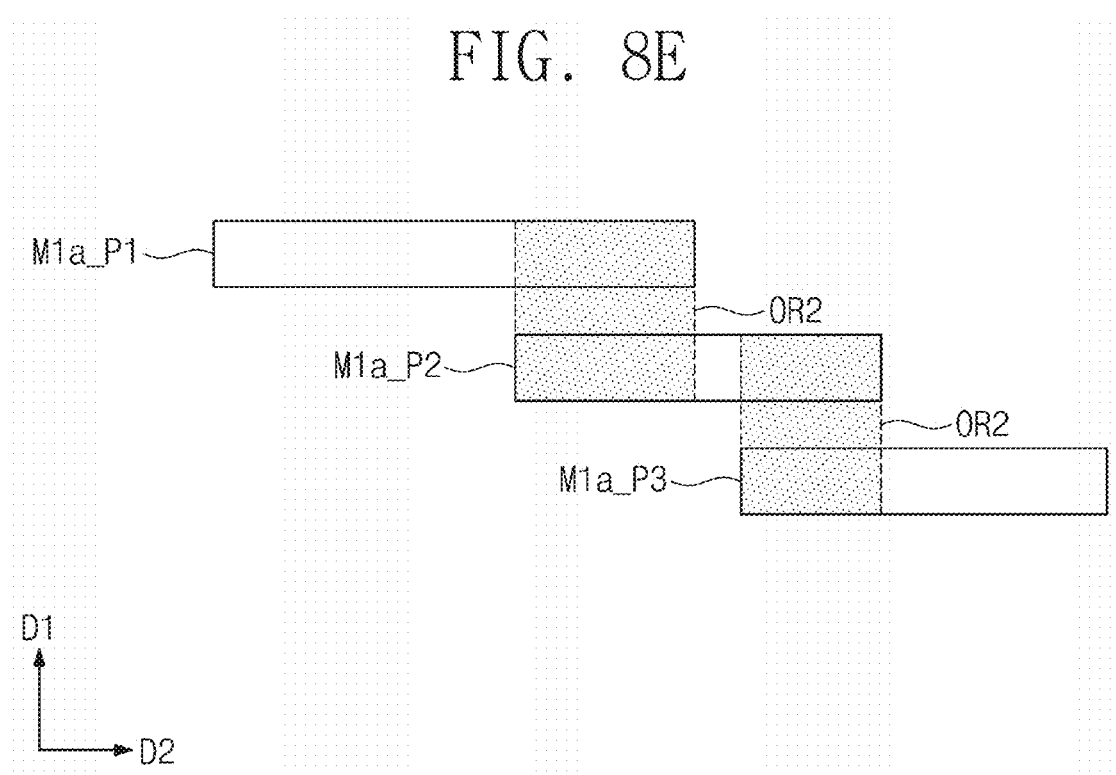

For example, referring to FIG. 8E, a first overlap region OR1 may be absent where the first, second, and third pin patterns M1a_P1, M1a_P2, and M1a_P3 overlap each other in the first direction D1. A second overlap region OR2 may be defined where a pair of adjacent pin patterns M1a_P overlap each other in the first direction D1. The second overlap region OR2 may have a length in the second direction D2 less than the third pitch P3. For example, the length of the second overlap region OR2 may be relatively small. Likewise, the standard cell STD of FIG. 5, the standard cell STD of FIG. 7 may securely have a high degree of routing freedom, and simultaneously, may decrease in capacitance between pin lines.

Figure 9:
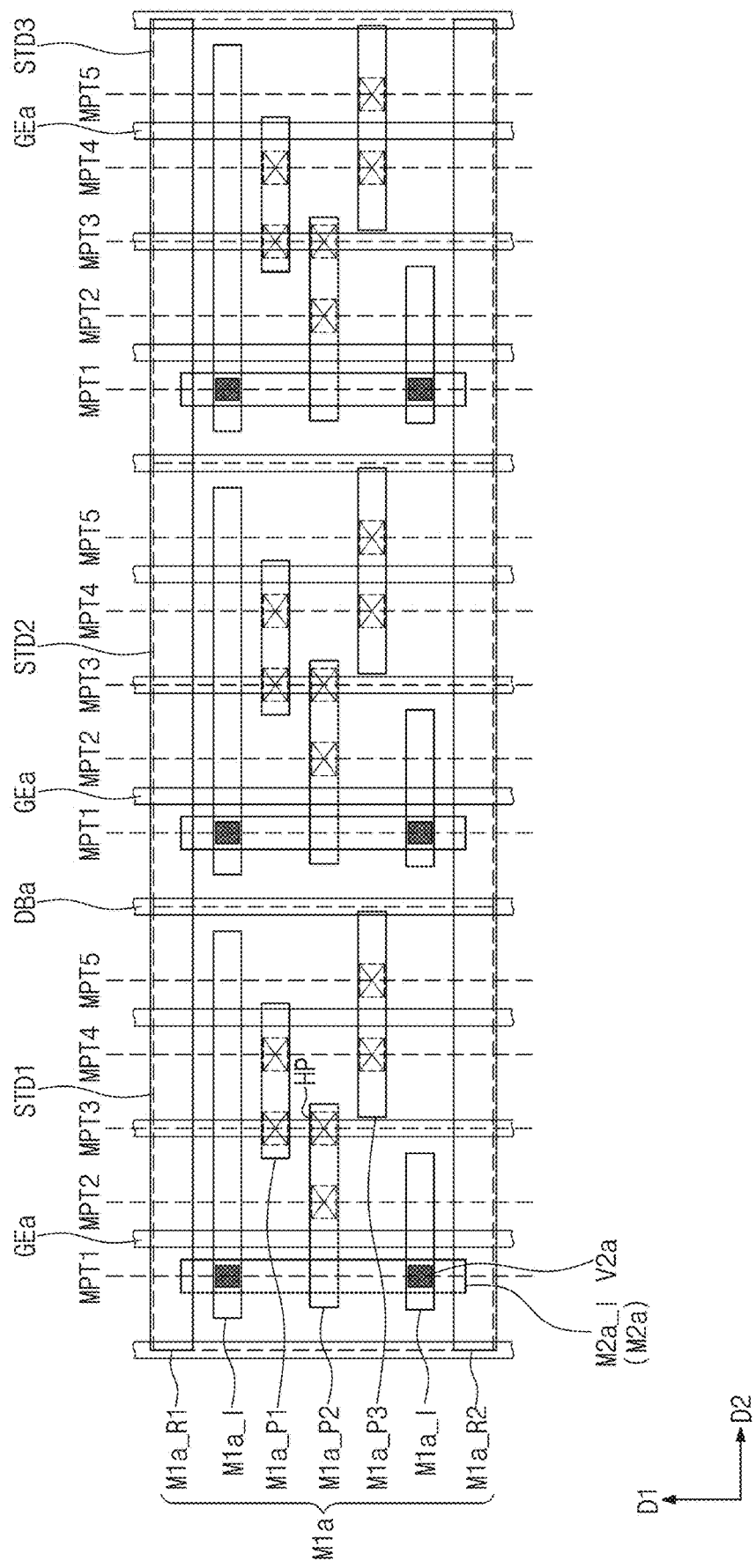
FIGS. 9 and 10 illustrate plan views of layouts, showing a standard-cell placement and routing step S30 of FIG. 2.
Figure 10:
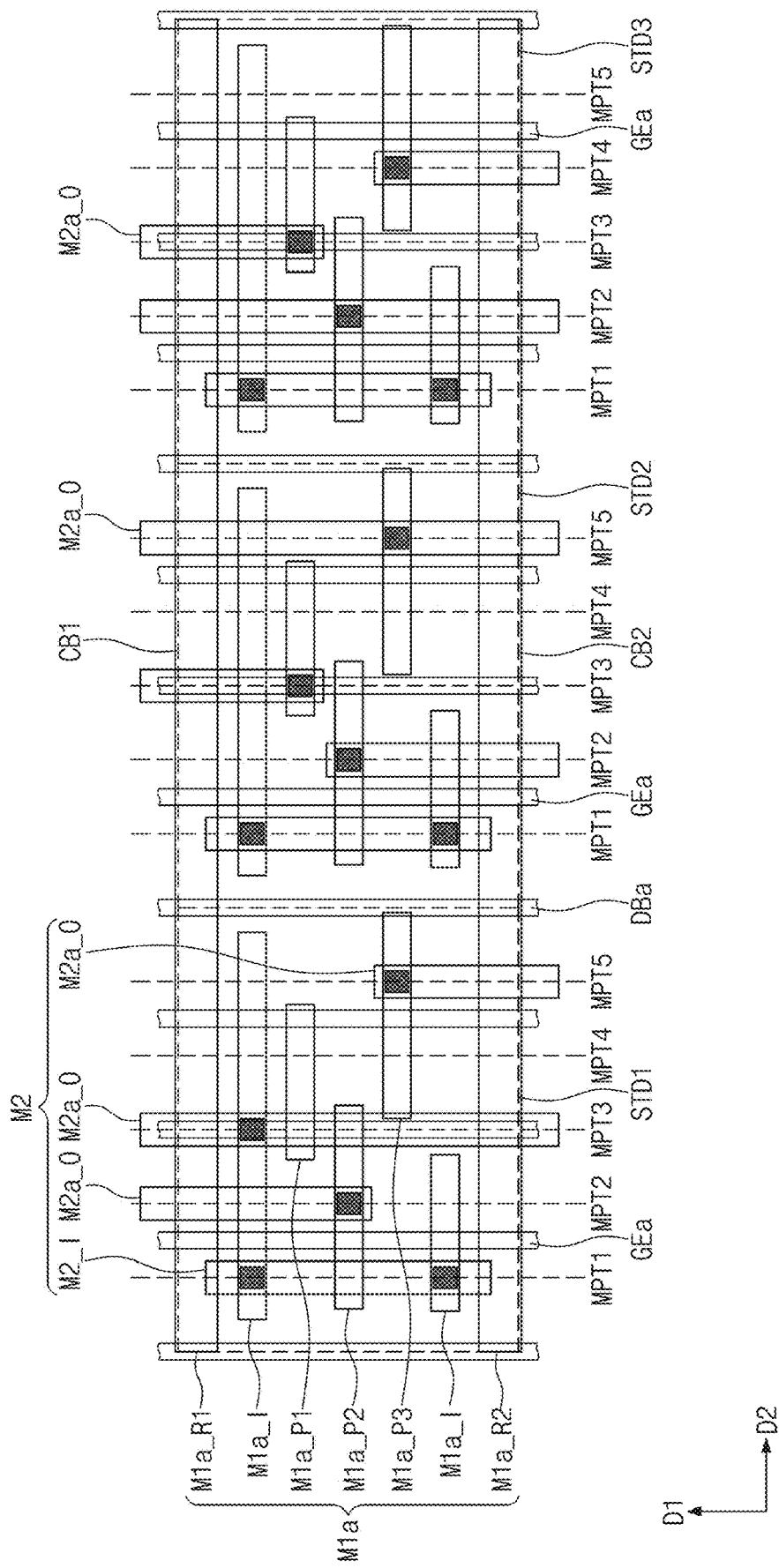

FIGS. 9 and 10 illustrate plan views of layouts, showing the standard-cell placement and routing step S30 of FIG. 2.

Referring to FIG. 9, first, second, and third standard cells STD1, STD2, and STD3 may be arranged in the second direction D2. For example, each of the first, second, and third standard cells STD1, STD2, and STD3 may be the designed standard cell STD of FIG. 5.

A separation pattern DBa may be interposed between ones of the first to third standard cells STD1, STD2, and STD3. For example, the separation patterns DBa may substitute for the gate patterns GEa on opposite sides of the first standard cell STD1.

Referring to FIG. 10, a routing step may be performed on the first to third standard cells STD1, STD2, and STD3. The routing of the first to third standard cells STD1, STD2, and STD3 may include placing routing patterns M2a_O. The placement of the routing patterns M2a_O may connect standard cells in accordance with a designed circuit.

A first cell boundary CB1 may be defined on each of the first, second, and third standard cells STD1, STD2, and STD3, which first cell boundary CB1 extends in the second direction D2. For each of the first, second, and third standard cells STD1, STD2, and STD3, a second cell boundary CB2 may be defined on a location opposite to that on which the first cell boundary CB1 is defined. The first power pattern M1a_R1 may be disposed on the first cell boundary CB1. The second power pattern M1a_R2 may be disposed on the second cell boundary CB2. In each the standard cells STD1, STD2, and STD3, the routing patterns M2a_O may extend beyond the first cell boundary CB1 or the second cell boundary CB2. The routing patterns M2a_O may be connected to the pin patterns M1a_P.

The routing patterns M2a_O may be disposed on the second to fifth line tracks MPT2 to MPT5. The routing patterns M2a_O and the second inner line pattern M2a_I may constitute the second line patterns M2a. The second line patterns M2a may define a second metal layer (second lines).

The via pattern V2a may be disposed on the hit point HP between the routing pattern M2a_O and the pin pattern M1a_P. The via pattern V2a on the hit point HP may define a connection between the routing pattern M2a_O and the pin pattern M1a_P.

After completion of replacement and routing of the standard cells according to FIGS. 9 and 10, an optical proximity correction may be performed on the designed layout, and a photomask may be manufactured. The manufactured photomask may be used for a semiconductor process, and therefore a semiconductor device may be manufactured (see FIG. 1).

Figure 11:
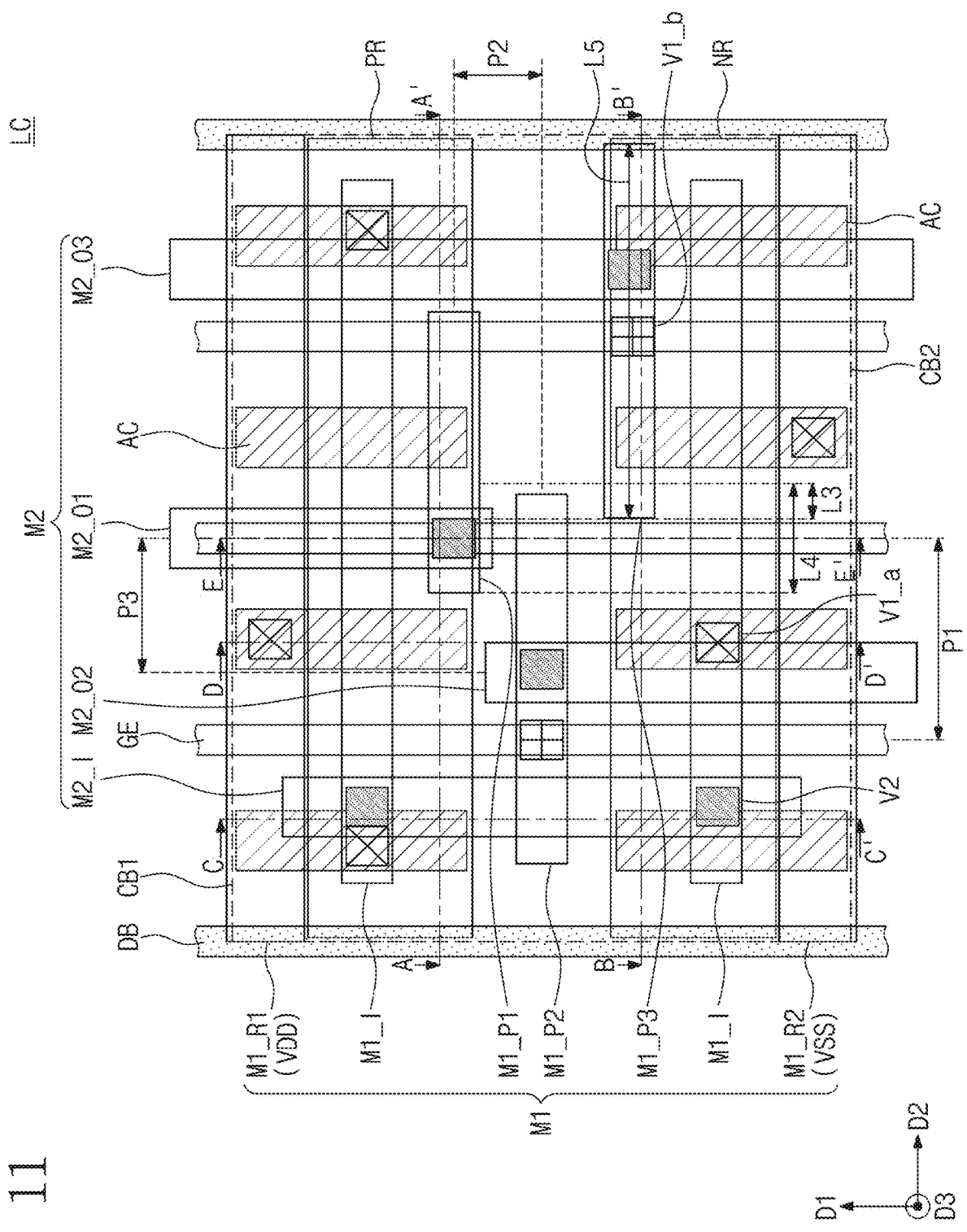
FIG. 11 illustrates a plan view showing a semiconductor device according to some example embodiments of the present inventive concepts.
Figure 12A:
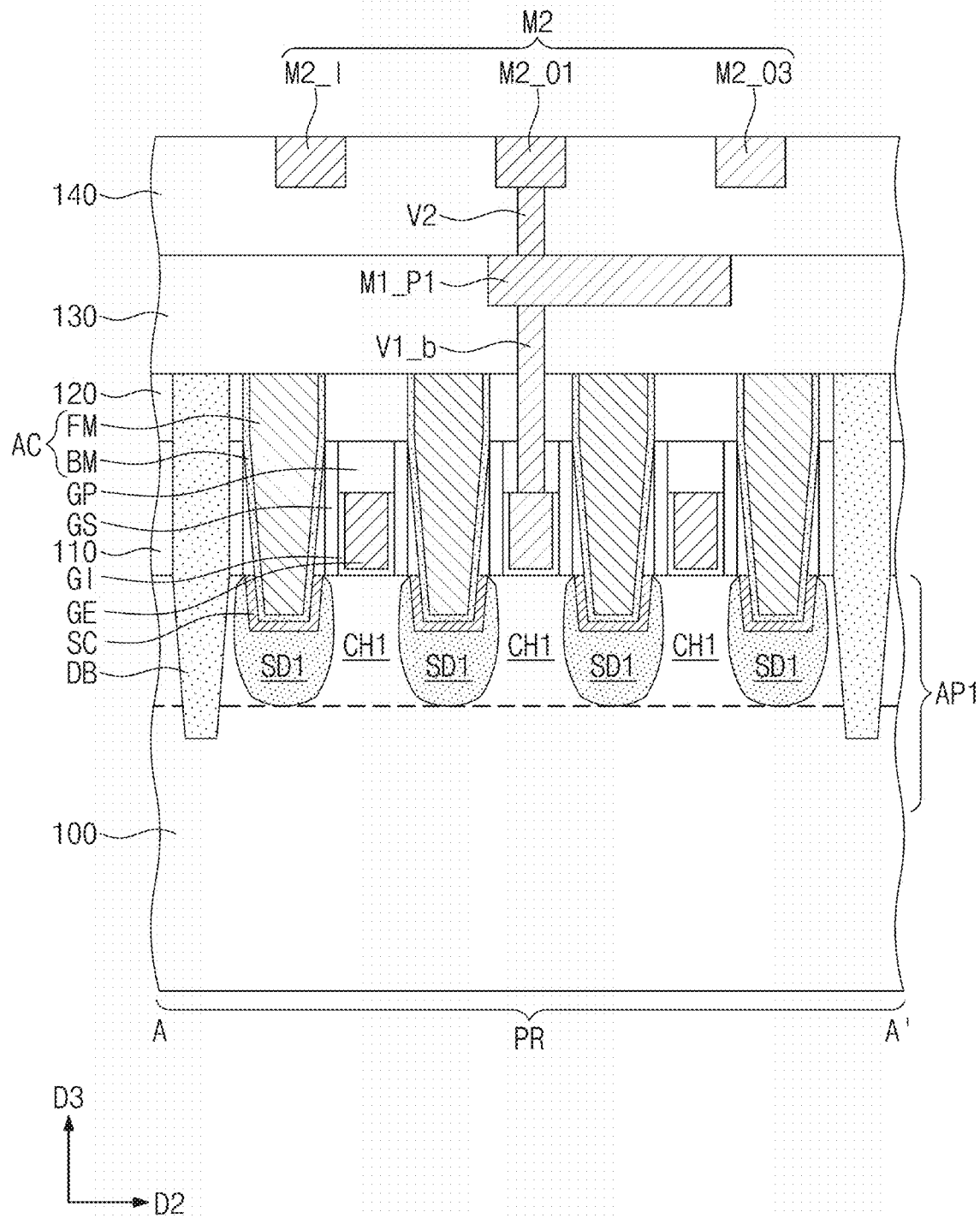
FIGS. 12A, 12B, 12C, 12D, and 12E illustrate cross-sectional views respectively taken along lines A-A', B-B', C-C', D-D', and E-E' of FIG. 11.
Figure 12B:
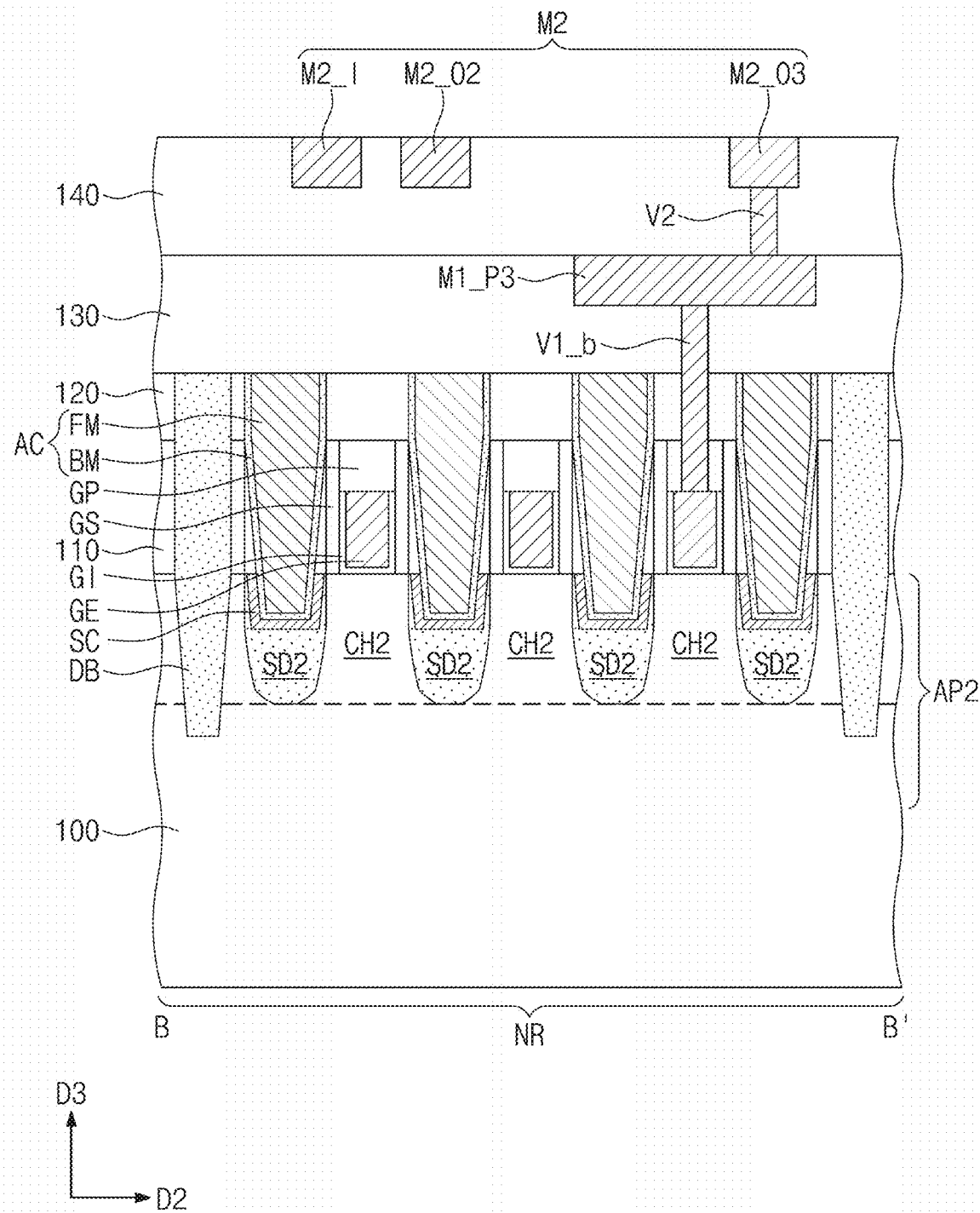
Figure 12C:
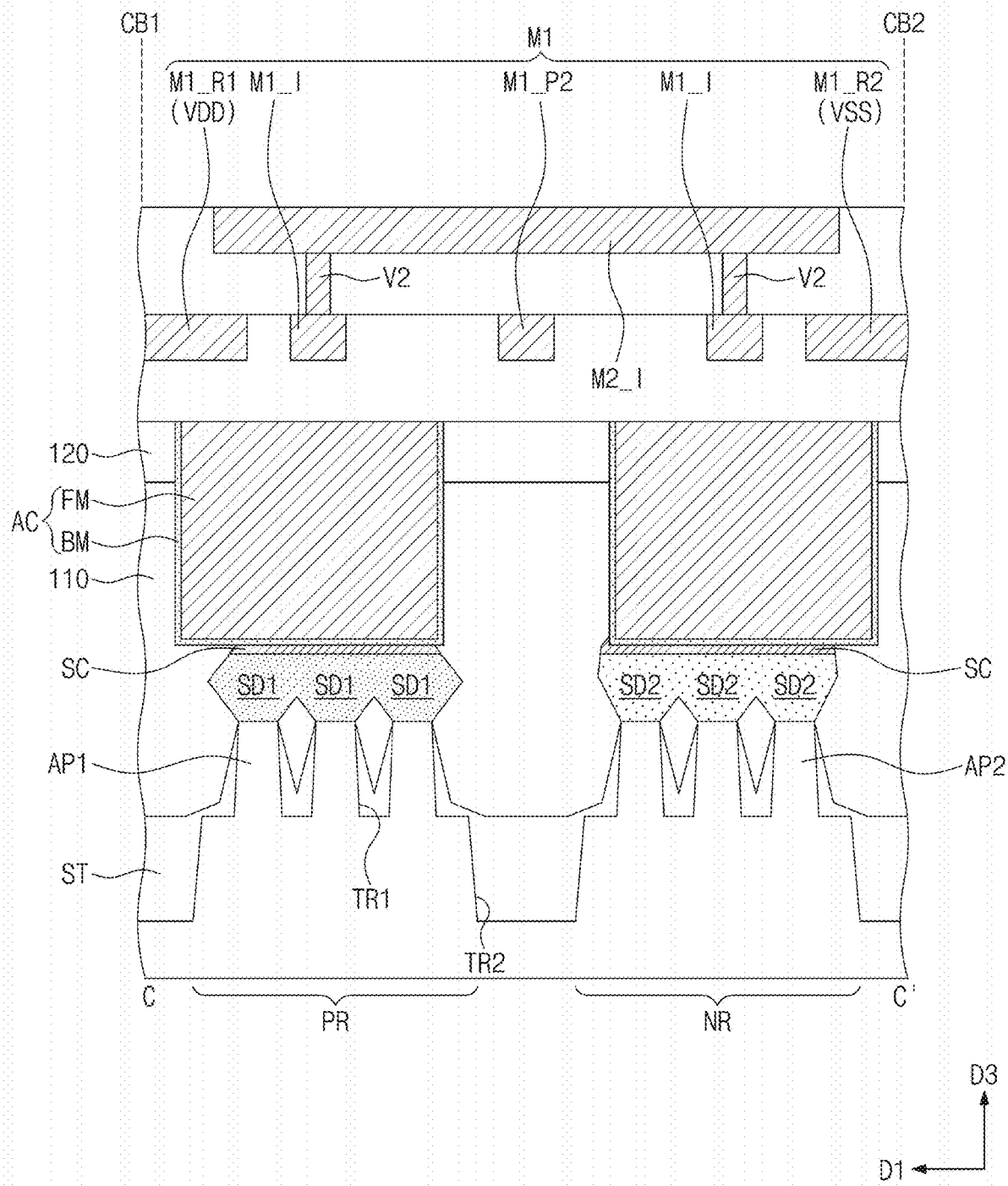
Figure 12D:
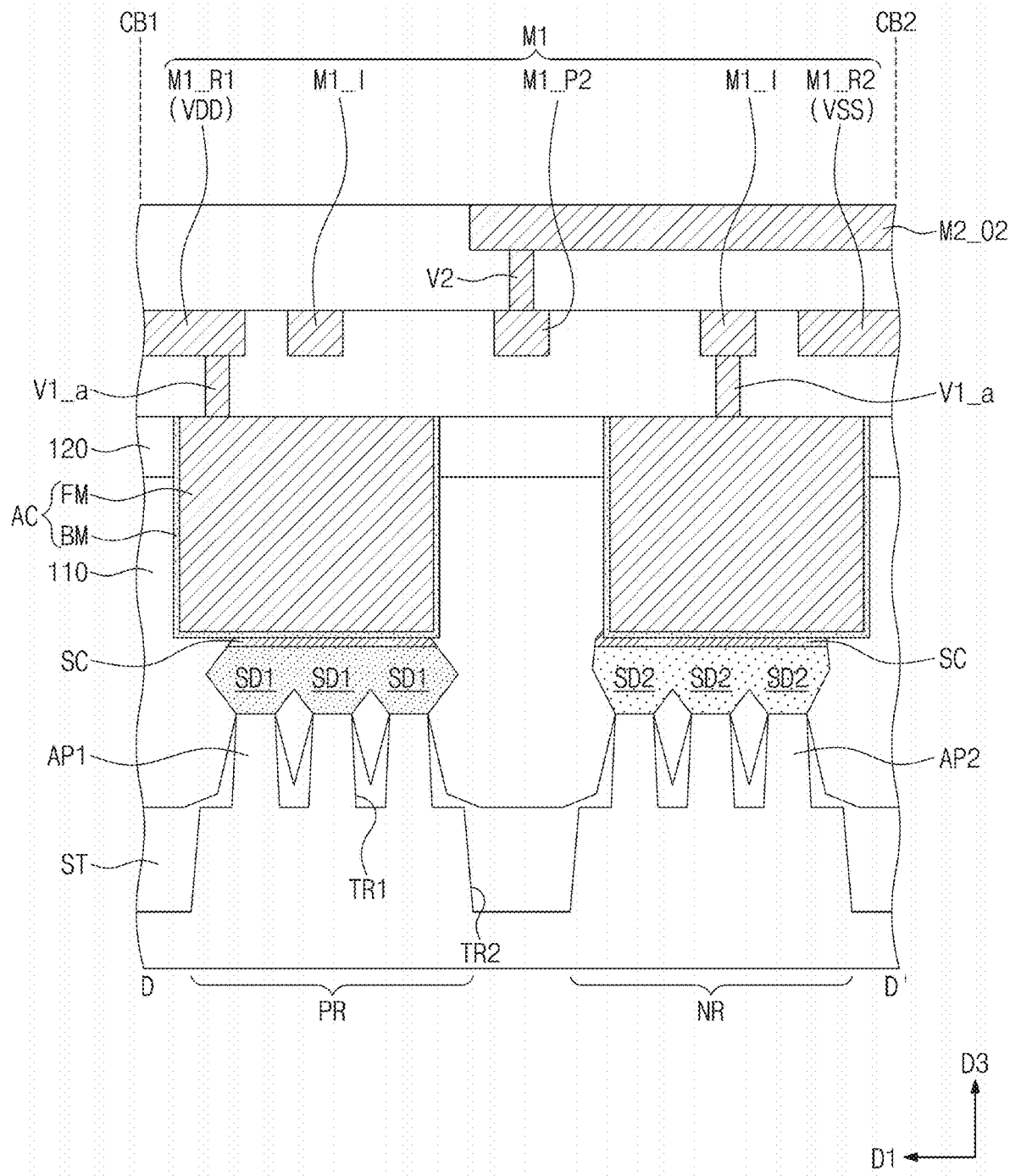
Figure 12E:
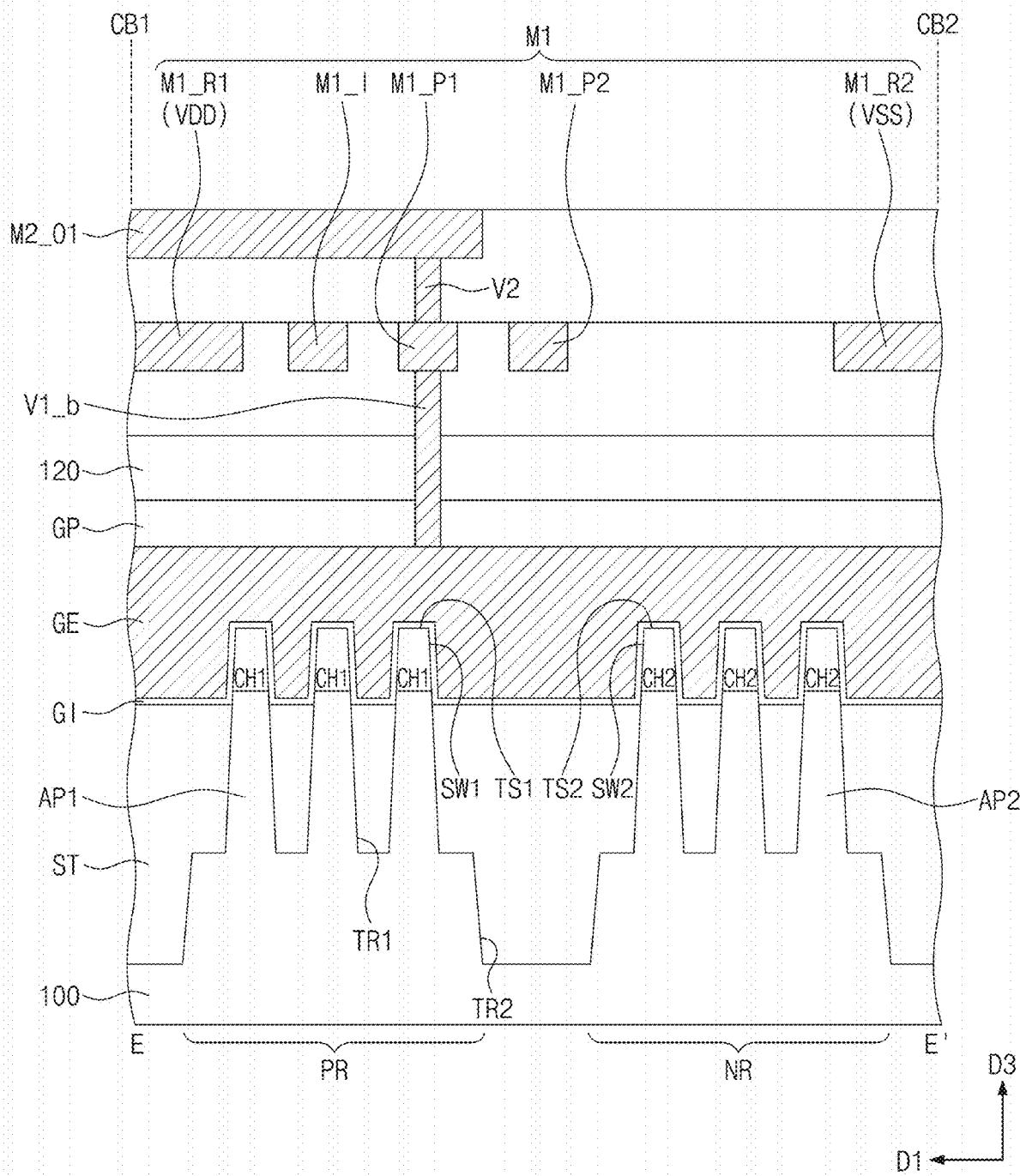

FIG. 11 illustrates a plan view showing a semiconductor device according to some example embodiments of the present inventive concepts. FIGS. 12A, 12B, 12C, 12D, and 12E illustrate cross-sectional views respectively taken along lines A-A', B-B', C-C', D-D', and E-E' of FIG. 11. FIGS. 11 and 12A to 12E exemplarily show a semiconductor device that is actually achieved on a substrate when the designed second standard cell STD2 of FIG. 10 is used.

Referring to FIGS. 11, 12A to 12E, a logic cell LC may be provided on a substrate 100. The logic cell LC may be provided thereon with logic transistors that constitute a logic circuit.

The substrate 100 may include a first active region PR and a second active region NR. In some example embodiments of the present inventive concepts, the first active region PR may be a PMOSFET area, and the second active region NR may be an NMOSFET area. The substrate 100 may be a compound semiconductor substrate or a semiconductor substrate including silicon, germanium, or silicon-germanium. For example, the substrate 100 may be a silicon substrate.

The first active region PR and the second active region NR may be defined by a second trench TR2 formed on an upper portion of the substrate 100. The second trench TR2 may be positioned between the first active region PR and the second active region NR. The first active region PR and the second active region NR may be spaced apart from each other in a first direction D1 across the second trench TR2. Each of the first and second active regions PR and NR may extend in a second direction D2 intersecting the first direction D1.

First active patterns AP1 and second active patterns AP2 may be respectively provided on the first active region PR and the second active region NR. The first and second active patterns AP1 and AP2 may extend parallel to each other in the second direction D2. The first and second active patterns AP1 and AP2 may be vertically protruding portions of the substrate 100. A first trench TR1 may be defined between adjacent first active patterns AP1 and between adjacent second active patterns AP2. The first trench TR1 may be shallower than the second trench TR2.

A device isolation layer ST may fill the first and second trenches TR1 and TR2. The device isolation layer ST may include a silicon oxide layer. The first and second active patterns AP1 and AP2 may have their upper portions that vertically protrude upwards from the device isolation layer ST (see FIG. 12E). Each of the upper portions of the first and second active patterns AP1 and AP2 may have a fin shape.

The device isolation layer ST may not cover the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces coplanar with those of the first and second channel patterns CH1 and CH2. In some example embodiments, the first and second source/drain patterns SD1 and SD2 may have their top surfaces higher than those of the first and second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and second active patterns AP1 and AP2. The gate electrodes GE may be arranged along the second direction D2 at a first pitch P1. The gate electrodes GE may vertically overlap the first and second channel patterns CH1 and CH2. Each of the gate electrodes GE may surround a top surface and opposite sidewalls of each of the first and second channel patterns CH1 and CH2.

Referring again to FIG. 12E, the gate electrode GE may be provided on a first top surface TS1 of the first channel pattern CH1 and also on at least one first sidewall SW1 of the first channel pattern CH1. The gate electrode GE may be provided on a second top surface TS2 of the second channel pattern CH2 and also on at least one second sidewall SW2 of the second channel pattern CH2. In this sense, a transistor according to the example embodiments may be a three-dimensional field effect transistor (e.g., FinFET) in which the gate electrode GE three-dimensionally surrounds the first and second channel patterns CH1 and CH2.

Referring back to FIGS. 11 and 12A to 12E, a pair of gate spacers GS may be disposed on opposite sidewalls of each of the gate electrodes GE. The gate spacers GS may extend in the first direction D1 along the gate electrodes GE. The gate spacers GS may have their top surfaces higher than those of the gate electrodes GE. The top surfaces of the gate spacers GS may be coplanar with that of a first interlayer dielectric layer 110 which will be discussed below. The gate spacers GS may include one or more of SiCN, SiCON, and/or SiN. Alternatively, the gate spacers GS may include a multi-layer including two or more of SiCN, SiCON, and/or SiN.

A gate capping pattern GP may be provided on each of the gate electrodes GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and/or SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and the first sidewall SW1 of the first channel pattern CH1. The gate dielectric pattern GI may cover the second top surface TS2 and the second sidewall SW2 of the second channel pattern CH2. The gate dielectric pattern GI may cover a top surface of the device isolation layer ST below the gate electrode GE (see FIG. 12E).

In some example embodiments of the present inventive concepts, the gate dielectric pattern GI may include a high-k dielectric material whose dielectric constant is greater than that of a silicon oxide layer. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a first metal pattern and a second metal pattern on the first metal pattern. The first metal pattern may be provided on the gated dielectric pattern GI and adjacent to the first and second channel patterns CH1 and CH2. The first metal pattern may include a work function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal which is selected from titanium (Ti), tantalum (Ta), aluminum (Al), tungsten (W), and molybdenum (Mo). The first metal pattern may further include carbon (C). The first metal pattern may include a plurality of work function metal layers that are stacked.

The second metal pattern may include metal whose resistance is lower than that of the first metal pattern. For example, the second metal pattern may include one or more of tungsten (W), aluminum (Al), titanium (Ti), and tantalum (Ta).

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with those of the gate capping patterns GP and those of the gate spacers GS. The first interlayer dielectric layer 110 may be provided thereon with a second interlayer dielectric layer 120 covering the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

The logic cell LC may be provided on its opposite sides with a pair of separation structures DB that face each other in the second direction D2. The separation structure DB may extend in the first direction D1 parallel to the gate electrodes GE. The separation structure DB and its adjacent gate electrode GE may be arranged at a first pitch P1.

The separation structure DB may penetrate the first and second interlayer dielectric layers 110 and 120 and may extend into the first and second active patterns AP1 and AP2. The separation structure DB may penetrate a corresponding one of the upper portions of the first and second active patterns AP1 and AP2. The separation structure DB may separate the first and second active regions PR and NR of the logic cell LC from an active region of an adjacent logic cell.

Active contacts AC may be provided to penetrate the first and second interlayer dielectric layers 110 and 120 and to have electrical connection with the first and second source/drain patterns SD1 and SD2. Each of the active contacts AC may be provided between a pair of gate electrodes GE.

The active contact AC may be a self-aligned contact. For example, the gate capping pattern GP and the gate spacer GS may be used to form the active contact AC in a self-aligned manner. For example, the active contact AC may cover at least a portion of a sidewall of the gate spacer GS. Although not shown, the active contact AC may partially cover the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, one or more of titanium silicide, tantalum silicide, tungsten silicide, nickel silicide, and cobalt silicide.

The active contact AC may include a conductive pattern FM and a barrier pattern BM surrounding the conductive pattern FM. For example, the conductive pattern FM may include one or more of aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include one or more of titanium, tantalum, tungsten, nickel, cobalt, and platinum. The metal nitride layer may include one or more of a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer may be provided in the third interlayer dielectric layer 130. The first metal layer may include first lines M1, first lower vias V1_a, and second lower vias V1_b. The first and second lower vias V1_a and V1_b may be provided below the first lines M1.

The first lines M1 may include a first power line M1_R1 and a second power line M1_R2 that extend in the second direction D2 and run across the logic cell LC. A first cell boundary CB1 may be defined on the logic cell LC, which first cell boundary CB1 extends in the second direction D2. On the logic cell LC, a second cell boundary CB2 may be defined on a location opposite to that on which the first cell boundary CB1 is defined. The first power line M1_R1 may be disposed on the first cell boundary CB1. The first power line M1_R1 may extend in the second direction D2 along the first cell boundary CB1. The second power pattern M1_R2 may be disposed on the second cell boundary CB2. The second power line M1_R2 may extend in the second direction D2 along the second cell boundary CB2.

The first lines M1 may further include first inner lines M1_I and first, second, and third pin lines M1_P1, M1_P2, and M1_P3 between the first and second power lines M1_R1 and M1_R2. The first inner lines M1_I and the first, second, and third pin lines M1_P1, M1_P2, and M1_P3 may each have a linear or bar shape that extends in the second direction D2.

The first inner lines M1_I and the first, second, and third pin lines M1_P1, M1_P2, and M1_P3 may be arranged along the first direction D1 at a second pitch P2. The second pitch P2 may be less than the first pitch P1. The first, second, and third pin lines M1_P1, M1_P2, and M1_P3 may be adjacent to each other. The first, second, and third pin lines M1_P1, M1_P2, and M1_P3 may be sequentially arranged along the first direction D1.

As discussed above with reference to FIG. 8C, a third length L3 may be given to a first overlap region OR1 where the first, second, and third pin lines M1_P1, M1_P2, and M1_P3 overlap each other in the first direction D1. The third length L3 may be less than the first pitch P1. The third length L3 may be less than the third pitch P3.

A fourth length L4 may be given to a second overlap region OR2 where adjacent first and second pin lines M1_P1 and M1_P2 overlap each other in the first direction D1. The fourth length L4 may be less than the first pitch P1. The fourth length L4 may be less than the third pitch P3.

Each of the first, second, and third pin lines M1_P1, M1_P2, and M1_P3 may have a length in the second direction D2 less than twice the first pitch P1. For example, the third pin line M1_P3 may have a fifth length L5 in the second direction D2. The fifth length L5 may be less than twice the first pitch P1.

The first lower vias V1_a may be correspondingly interposed between and may electrically connect the first lines M1 and the active contacts AC, The second lower vias V1_b may be correspondingly interposed between and may connect the first lines M1 and the gate electrodes GE.

For example, the first and second power lines M1_R1 and M1_R2 may be electrically connected through the first lower vias V1_a to corresponding active contacts AC. The first inner lines M1_1 may be electrically connected through the first lower vias V1_a to corresponding active contacts AC. The first, second, and third pin lines M1_P1, M1_P2, and M1_P3 may be electrically connected to the second lower vias V1_b to corresponding gate electrodes GE.

For example, the first line M1 and its underlying first or second lower via V1_a or V1_b may be integrally connected to each other to constitute a single conductive structure. For example, the first line M1 and the first or second via V1_a or V1_b may be formed together. A dual damascene process may be performed such that the first line M1 and either the first or second lower via V1_a or V1_b may be formed into a single conductive structure.

A second metal layer may be provided in the fourth interlayer dielectric layer 140. The second metal layer may include second lines M2 and second vias V2. The second vias V2 may be provided below the second lines M2. The second vias V2 may be interposed between and may electrically connect the second lines M2 and the first lines M1. The second line M2 and its underlying second via V2 may be connected to each other. For example, the second line M2 may be simultaneously formed with its underlying the second via V2. A dual damascene process may be performed to simultaneously form the second line M2 and the second via V2.

The second lines M2 may each have a linear or bar shape that extends in the first direction D1. For example, all of the second lines M2 may extend parallel to each other in the first direction D2. When viewed in plan, the second lines M2 may be parallel to the gate electrodes GE. The second lines M2 may be arranged along the second direction D2 at a third pitch P3. The third pitch P3 may be less than the first pitch P1. The third pitch P3 may be greater than the second pitch P2.

The second lines M2 may include a second inner line M23 and first, second, and third routing lines M2_O1, M2_O2, and M2_O3. The second inner line M2_I may extend from the first active region PR onto the second active region NR. The second inner line M2_I may not extend beyond the first cell boundary CB1. The second inner line M2_I may not extend beyond the second cell boundary CB2. For example, the second inner line M2_I may have one end positioned on the first active region PR and other end positioned on the second active region NR.

The second inner line M2_I on the first active region PR may be electrically connected to the first source/drain pattern SD1 through the second via V2, the first inner line M1_I, the first lower via V1_a, and the active contact AC. The second inner line M2_I on the second active region NR may be electrically connected to the second source/drain pattern SD2 through the second via V2, the first inner line M1_I, the first lower via V1_a, and the active contact AC.

In such cases, the first and second inner lines M1_I and M2_i in the logic cell LC may electrically connect a PMOS transistor (PMOSFET) of the first active region PR to an NMOS transistor (NMOSFET) of the second active region NR. The first and second inner lines ML_I and M2_i in the logic cell LC may electrically connect a source/drain of the PMOSFET to a source/drain of the NMOSFET. The first and second inner lines M1_I and M2_I may be lines that constitute a logic circuit of the logic cell LC.

Each of the first, second, and third routing lines M2_O1, M2_O2, and M2_O3 may extend beyond the first cell boundary CB1 or the second cell boundary CB2. The first routing line M2_O1 may extend onto a first logic cell that is adjacent in the first direction D1 to the logic cell LC. The second routing line M2_O2 may extend onto a second logic cell that is adjacent in a direction opposite to the first direction D1 to the logic cell LC. The third routing line M2_O3 may extend from the first logic cell onto the second logic cell, while running across the logic cell LC. For example, the first, second, and third routing lines M2_O1, M2_O2, and M2_O3 may connect a logic circuit of the logic cell LC to a logic circuit of another logic cell.

The first, second, and third routing lines M2_O1, M2_O2, and M2_O3 may be electrically connected through the second vias V2 to the first, second, and third pin lines M1_P1, M1_P2, and M1_P3, respectively. The logic cell LC may be configured such that the pin line M1_P receives signals through the routing line M2_O. The logic cell LC may also be configured such that the pin line M1_P outputs signals through the routing line M2_O. For example, referring to FIG. 12A, the logic cell LC may be configured such that the gate electrode GE receives signals through the routing line M2_O, the second via V2, the pin line M1_P, and the second lower via V1_b.

The first lines M1, the first vias V1, the second lines M2, and the second vias V2 may include the same conductive material. For example, the first lines M1, the first vias V1, the second lines M2, and the second vias V2 may include at least one metallic material selected from aluminum, copper, tungsten, molybdenum, and cobalt. Although not shown, additional metal layers may be stacked on the fourth interlayer dielectric layer 140. Each of the stacked metal layers may include routing lines.

FIGS. 13A, 13B, 13C, 13D, and 13E illustrate cross-sectional views respectively taken along lines A-A', B-B', C-C', D-D', and E-E' of FIG. 11, showing a semiconductor device according to some example embodiments of the present inventive concepts. In the example embodiments that follow, a detailed description of technical features repetitive to those discussed above with reference to FIGS. 11 and 12A to 12E will be omitted, and differences from those discussed above with reference to FIGS. 1 and 12A to 12E will be discussed in detail.

Referring to FIGS. 11 and 13A to 13E, a substrate 100 may be provided which includes a first active region PR and a second active region NR. A device isolation layer ST may be provided on the substrate 100. The device isolation layer ST may define a first active pattern AP1 and a second active pattern AP2 on an upper portion of the substrate 100. The first active pattern AP1 and the second active pattern AP2 may be respectively defined on the first active region PR and the second active region NR.

The first active pattern AP1 may include first channel patterns CH1 that are vertically stacked. The stacked first channel patterns CH1 may be spaced apart from each other in a third direction D3. The stacked first channel patterns CH1 may vertically overlap each other. The second active pattern AP2 may include second channel patterns CH2 that are vertically stacked. The stacked second channel patterns CH2 may be spaced apart from each other in the third direction D3. The stacked second channel patterns CH2 may vertically overlap each other. The first and second channel patterns CH1 and CH2 may include one or more of silicon (Si), germanium (Ge), and silicon-germanium (SiGe).

The first active pattern AP1 may further include first source/drain patterns SD1. The stacked first channel patterns CH1 may be interposed between a pair of adjacent first source/drain patterns SD1. The stacked first channel patterns CH1 may connect the pair of adjacent first source/drain patterns SD1 to each other.

The second active pattern AP2 may further include second source/drain patterns SD2. The stacked second channel patterns CH2 may be interposed between a pair of adjacent second source/drain patterns SD2. The stacked second channel patterns CH2 may connect the pair of adjacent second source/drain patterns SD2 to each other.

Gate electrodes GE may be provided to extend in a first direction D1, while running across the first and second channel patterns CH1 and CH2. The gate electrode GE may vertically overlap the first and second channel patterns CH1 and CH2. A pair of gate spacers GS may be disposed on opposite sidewalls of the gate electrode GE. A gate capping pattern GP may be provided on the gate electrode GE.

Figure 13A:
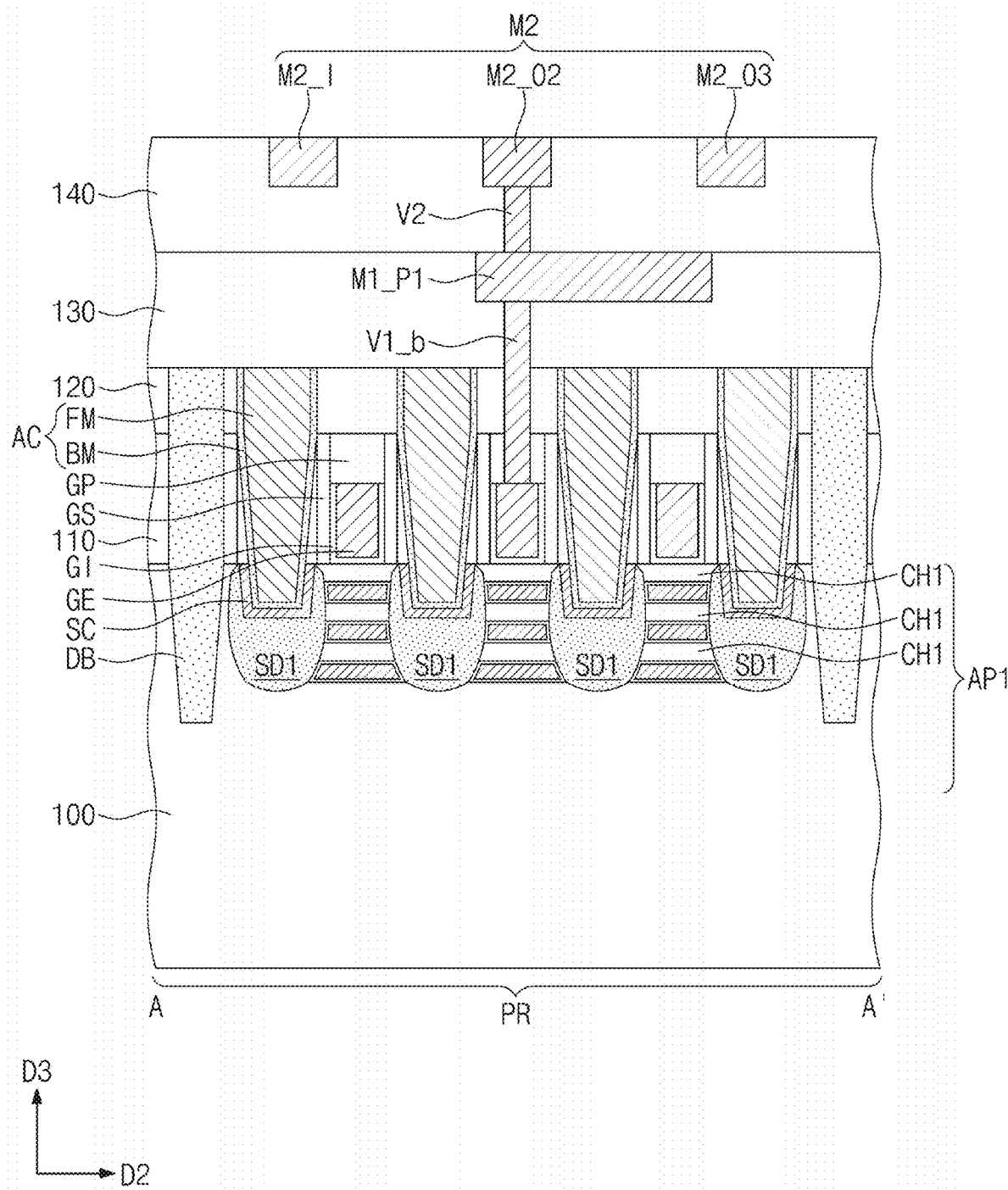
FIGS. 13A, 13B, 13C, 13D, and 13E illustrate cross-sectional views respectively taken along lines A-A', B-B', C-C', D-D', and E-E' of FIG. 11, showing a semiconductor device according to some example embodiments of the present inventive concepts.
Figure 13B:
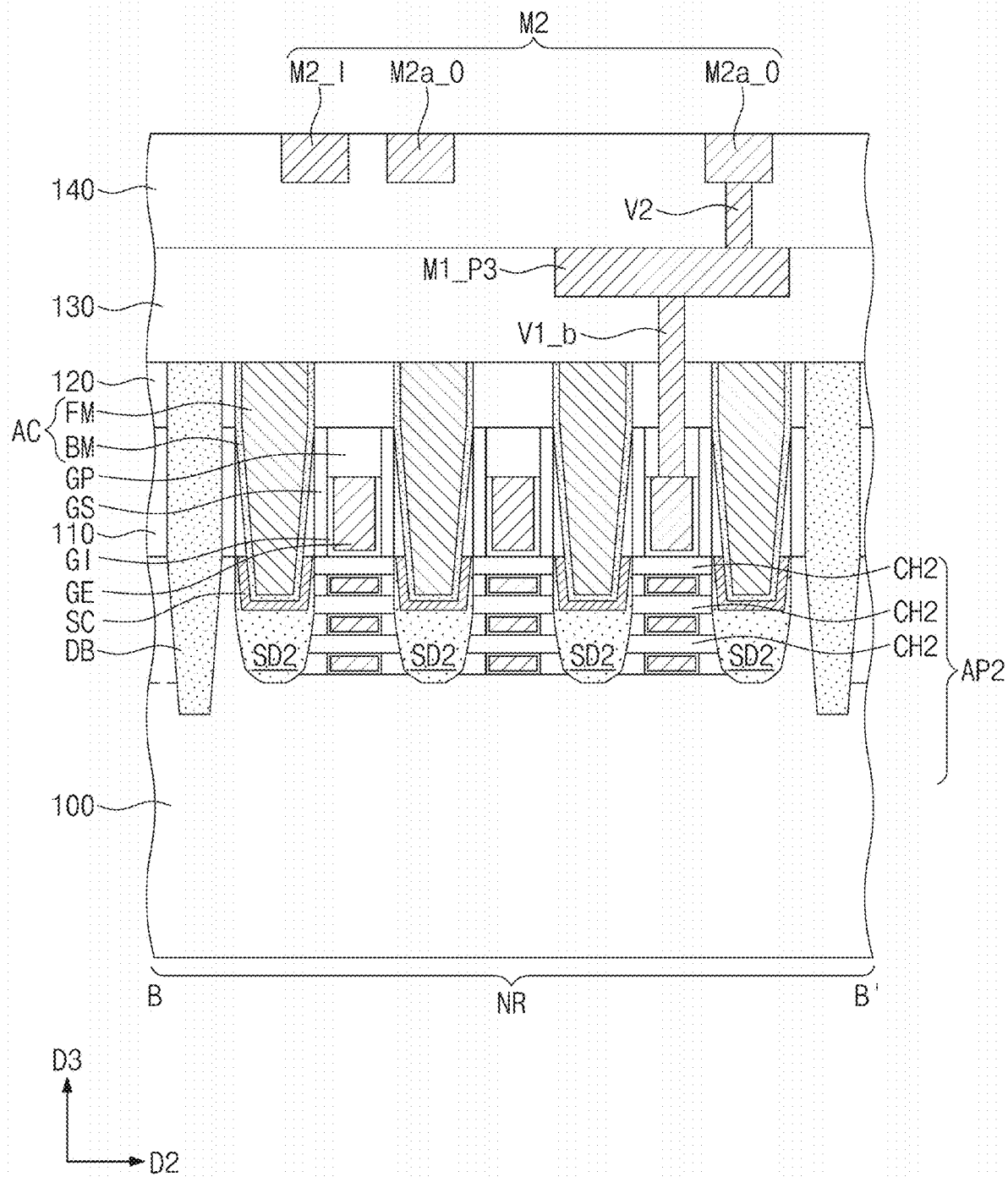
Figure 13C:
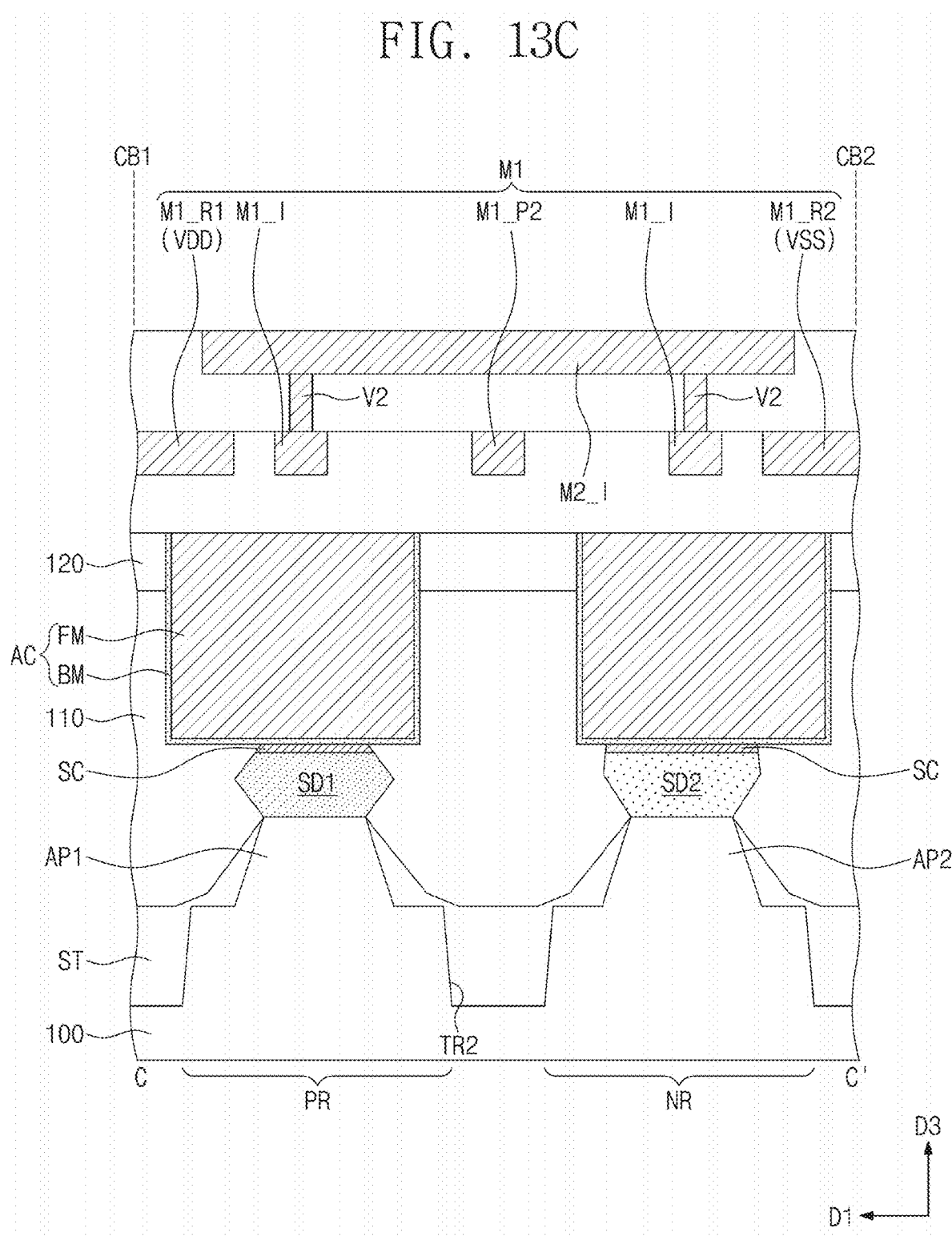
Figure 13D:
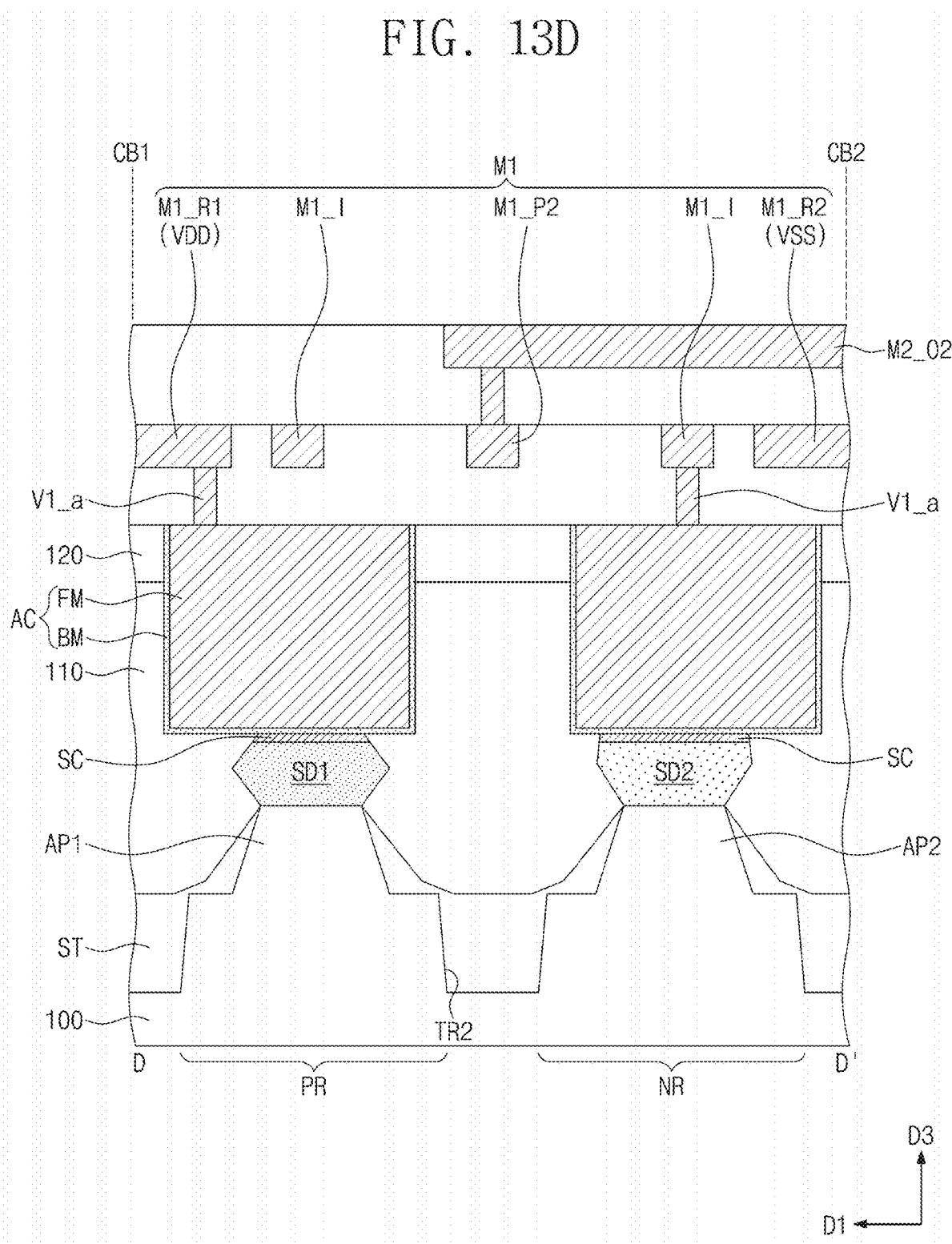
Figure 13E:
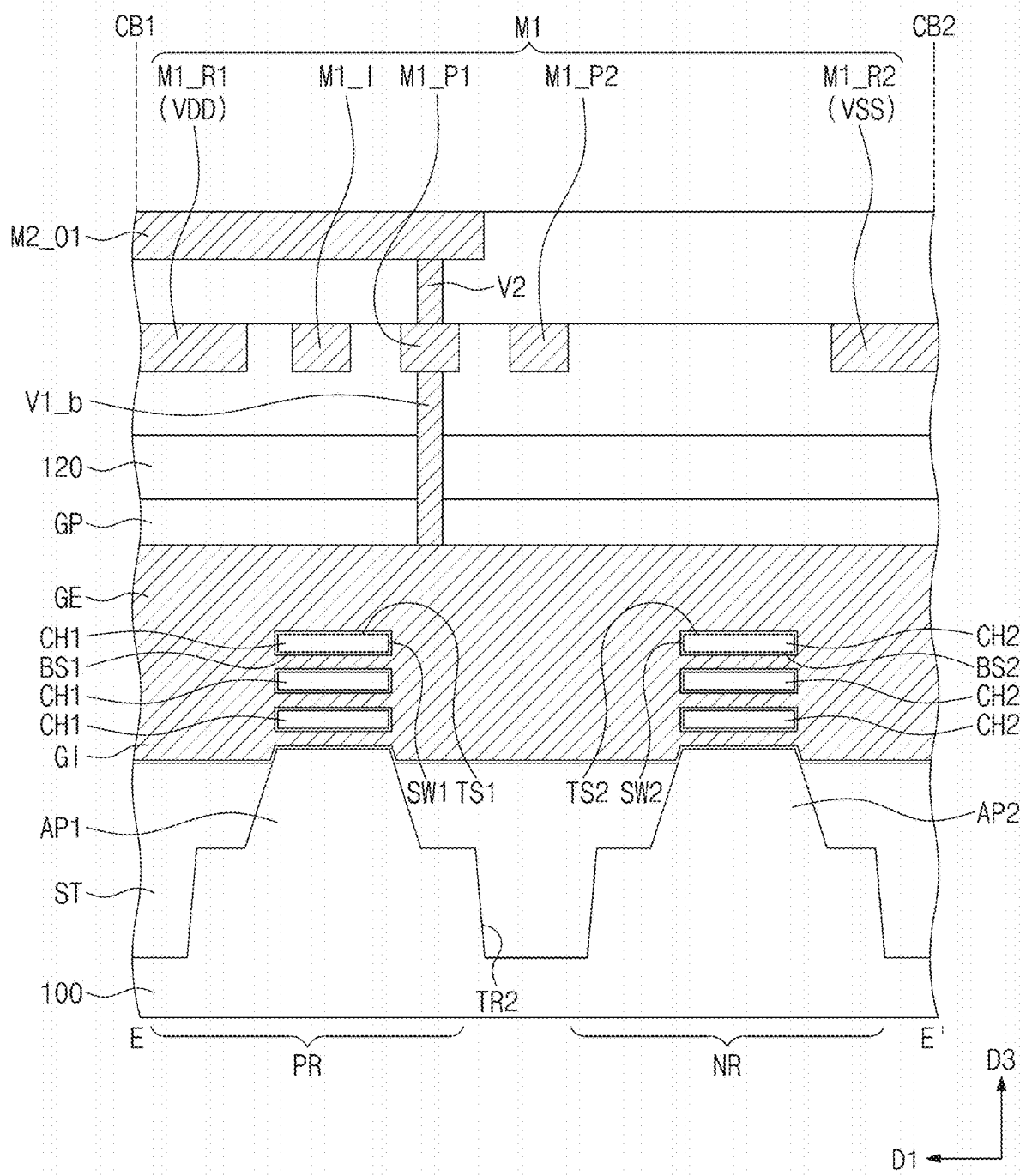

The gate electrode GE may surround each of the first and second channel regions CH1 and CH2 (see FIG. 13E). The gate electrode GE may be provided on a first top surface TS1 of the first channel pattern CH1, at least one first sidewall SW1 of the first channel pattern CH1, and a first bottom surface BS1 of the first channel pattern CH1. The gate electrode GE may be provided on a second top surface TS2 of the second channel pattern CH2, at least one second sidewall SW2 of the second channel pattern CH2, and a second bottom surface BS2 of the second channel pattern CH2. For example, the gate electrode GE may surround a top surface, a bottom surface, and opposite sidewalls of each of the first and second channel patterns CH1 and CH2. In this sense, a transistor according to example embodiments may be a three-dimensional field effect transistor (e.g.

FinFET) in which the gate electrode GE three-dimensionally surrounds the first and second channel patterns CH1 and CH2.

A gate dielectric pattern GI may be provided between the gate electrode GE and each of the first and second channel patterns CH1 and CH2. The gate dielectric pattern GI may surround each of the first and second channel patterns CH1 and CH2.

On the second active region NR, a dielectric pattern IP may be interposed between the gate dielectric pattern GI and the second source/drain pattern SD2. The gate dielectric pattern GI and the dielectric pattern IP may separate the gate electrode GE from the second source/drain pattern SD2. In contrast, no dielectric pattern IP may be provided on the first active region PR.

A first interlayer dielectric layer 110 and a second interlayer dielectric layer 120 may be provided on an entire surface of the substrate 100. Active contacts AC may be provided to penetrate the first and second interlayer dielectric layers 110 and 120 and to correspondingly have connection with the first and second source/drain patterns SD1 and SD2.

A third interlayer dielectric layer 130 may be provided on the second interlayer dielectric layer 120. A fourth interlayer dielectric layer 140 may be provided on the third interlayer dielectric layer 130. A first metal layer may be provided in the third interlayer dielectric layer 130. The first metal layer may include first lines M1, first lower vias V1_a, and second lower vias V1_b. A second metal layer may be provided in the fourth interlayer dielectric layer 140. The second metal layer may include second lines M2 and second vias V2.

A description of the first and second metal layers may be substantially the same as that discussed above with reference to FIGS. 11 and 12A to 12E.

According to the present inventive concepts, a semiconductor device may increase its degree of routing freedom of a logic cell. Furthermore, despite the increase in degree of routing freedom, a capacitance between pin lines may be reduced to increase electrical characteristics.

Although some example embodiments of the present inventive concepts have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising:
    a logic cell on a substrate, the logic cell including a first active region and a second active region spaced apart in a first direction;
    a first active pattern on the first active region, and a second active pattern on the second active region, the first and second active patterns extending in a second direction that intersects the first direction;
    a first source/drain pattern on an upper portion of the first active pattern and a second source/drain pattern on an upper portion of the second active pattern;
    a plurality of gate electrodes that run across the first and second active patterns and extend in the first direction, the gate electrodes arranged in the second direction at a first pitch;
    a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and
    a plurality of second lines in a second interlayer dielectric layer on the first interlayer dielectric layer, the second lines extending parallel to each other in the first direction,
    wherein
    the first lines include first to third pin lines,
    the second lines include first to third routing lines,
    the first to third pin lines are electrically connected respectively to the first to third routing lines,
    a length in the second direction of each of the first to third pin lines is less than twice the first pitch,
    a first overlap region is defined where adjacent ones of the first to third pin lines overlap each other in the first direction, and
    a length in the second direction of the first overlap region is less than the first pitch.

2. The semiconductor device of claim 1, wherein
    the first lines are arranged in the first direction at a second pitch,
    the second lines are arranged in the second direction at a third pitch,
    the third pitch is less than the first pitch, and
    the third pitch is greater than the second pitch.

3. The semiconductor device of claim 2, wherein the length in the second direction of the first overlap region is less than the third pitch.

4. The semiconductor device of claim 2, wherein a second overlap region is defined where the first to third pin lines overlap each other in the first direction,
    wherein a length in the second direction of the second overlap region is less than the third pitch.

5. The semiconductor device of claim 1, wherein first to third lower line tracks are on a first metal layer,
    wherein the first to third pin lines are respectively on the first to third lower line tracks.

6. The semiconductor device of claim 1, wherein the logic cell has a first cell boundary and a second cell boundary opposite to the first cell boundary,
    wherein the first and second cell boundaries extend in the second direction, and
    wherein each of the first to third routing lines crosses the first cell boundary or the second cell boundary, the each of the first to third routing lines extending outside the logic cell.

7. The semiconductor device of claim 6, wherein the first lines further include a first power line on the first cell boundary and a second power line on the second cell boundary.

8. The semiconductor device of claim 1, wherein
    the first lines further include a first inner line,
    the second lines further include a second inner line,
    one end of the second inner line is on the first active region, and other end of the second inner line is on the second active region, and
    the first inner line is electrically connected to the second inner line.

9. The semiconductor device of claim 1, further comprising a device isolation layer that covers lower sidewalls of the first and second active patterns,
    wherein the upper portion of each of the first and second active patterns vertically protrudes upwards from the device isolation layer.

10. The semiconductor device of claim 1, wherein
the first active pattern includes a plurality of first channel patterns that are vertically stacked,
the second active pattern includes a plurality of second channel patterns that are vertically stacked,
a first gate electrode of the gate electrodes is on a top surface, a bottom surface, and opposite sidewalls of each of the first channel patterns, and
a second gate electrode of the gate electrodes is on a top surface, a bottom surface, and opposite sidewalls of each of the second channel patterns.

11. A semiconductor device, comprising:
a logic cell on a substrate, the logic cell including a first active region and a second active region spaced apart in a first direction;
a first active pattern on the first active region and a second active pattern on the second active region, the first and second active patterns extending in a second direction that intersects the first direction;
a device isolation layer that covers lower sidewalls of the first and second active patterns, an upper portion of each of the first and second active patterns vertically protruding upwards from the device isolation layer;
a first source/drain pattern on the upper portion of the first active pattern and a second source/drain pattern on the upper portion of the second active pattern;
a plurality of gate electrodes that run across the first and second active patterns and extend in the first direction, the gate electrodes arranged in the second direction at a first pitch;
a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and
a plurality of second lines in a second interlayer dielectric layer on the first interlayer dielectric layer, the second lines extending parallel to each other in the first direction,
wherein
the first lines include first to third pin lines,
the second lines include first to third routing lines,
the first to third pin lines are electrically connected respectively to the first to third routing lines,
a length in the second direction of each of the first to third pin lines is less than twice the first pitch,
a first overlap region is defined where the first to third pin lines overlap each other in the first direction, and
a length in the second direction of the first overlap region is less than the first pitch.

12. The semiconductor device of claim 11, wherein
the first lines are arranged in the first direction at a second pitch,
the second lines are arranged in the second direction at a third pitch,
the third pitch is less than the first pitch, and
the third pitch is greater than the second pitch.

13. The semiconductor device of claim 12, wherein the length in the second direction of the first overlap region is less than the third pitch.

14. The semiconductor device of claim 11, wherein a second overlap region is defined where adjacent ones of the first to third pin lines overlap each other in the first direction, wherein a length in the second direction of the second overlap region is less than the first pitch.

15. The semiconductor device of claim 11, wherein first to third lower line tracks are on a first metal layer,
wherein the first to third pin lines are respectively on the first to third lower line tracks.

16. A semiconductor device, comprising:
a logic cell on a substrate, the logic cell including a first active region and a second active region spaced apart in a first direction;
a first active pattern on the first active region and a second active pattern on the second active region, the first and second active patterns extending in a second direction that intersects the first direction, the first active pattern including a plurality of first channel patterns that are vertically stacked, and the second active pattern including a plurality of second channel patterns that are vertically stacked;
a first source/drain pattern and a second source/drain pattern, the first source/drain pattern being on one side of the first channel patterns, and the second source/drain pattern being on one side of the second channel patterns;
a plurality of gate electrodes that run across the first and second active patterns and extend in the first direction, the gate electrodes arranged in the second direction at a first pitch;
a plurality of first lines in a first interlayer dielectric layer on the gate electrodes, each of the first lines being electrically connected to the first source/drain pattern, the second source/drain pattern, or the gate electrode, and the first lines extending parallel to each other in the second direction; and
a plurality of second lines in a second interlayer dielectric layer on the first interlayer dielectric layer, the second lines extending parallel to each other in the first direction,
wherein
a first gate electrode of the gate electrodes is on a top surface, a bottom surface, and opposite sidewalls of each of the first channel patterns,
a second gate electrode of the gate electrodes is on a top surface, a bottom surface, and opposite sidewalls of each of the second channel patterns,
the first lines include first to third pin lines,
the second lines include first to third routing lines,
the first to third pin lines are electrically connected respectively to the first to third routing lines,
a length in the second direction of each of the first to third pin lines is less than twice the first pitch,
a first overlap region is defined where the first to third pin lines overlap each other in the first direction, and
a length in the second direction of the first overlap region is less than the first pitch.

17. The semiconductor device of claim 16, wherein
the first lines are arranged in the first direction at a second pitch,
the second lines are arranged in the second direction at a third pitch,
the third pitch is less than the first pitch, and
the third pitch is greater than the second pitch.

18. The semiconductor device of claim 17, wherein the length in the second direction of the first overlap region is less than the third pitch.

19. The semiconductor device of claim 16, wherein a second overlap region is defined where adjacent ones of the first to third pin lines overlap each other in the first direction, wherein a length in the second direction of the second overlap region is less than the first pitch.

20. The semiconductor device of claim 16, wherein first to third lower line tracks are on a first metal layer,
wherein the first to third pin lines are respectively on the first to third lower line tracks.

* * * * *